US012563786B2

(12) United States Patent
Zhang et al.

(10) Patent No.: US 12,563,786 B2
(45) Date of Patent: Feb. 24, 2026

(54) SINGLE WORK FUNCTION METAL AND MULTIPLE THRESHOLD VOLTAGE SCHEME

(71) Applicant: International Business Machines Corporation, Armonk, NY (US)

(72) Inventors: Jingyun Zhang, Albany, NY (US); Takashi Ando, Eastchester, NY (US); Paul Charles Jamison, Averill Park, NY (US)

(73) Assignee: International Business Machines Corporation, Armonk, NY (US)

( * ) Notice: Subject to any disclaimer, the term of this patent is extended or adjusted under 35 U.S.C. 154(b) by 381 days.

(21) Appl. No.: 18/459,689

(22) Filed: Sep. 1, 2023

(65) Prior Publication Data

US 2025/0081528 A1      Mar. 6, 2025

(51) Int. Cl.
H10D 30/67 (2025.01)
H10D 30/01 (2025.01)
(Continued)

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 64/017* (2025.01); *H10D 84/0167* (2025.01); *H10D 84/0177* (2025.01); *H10D 84/038* (2025.01); *H10D 84/85* (2025.01)

(58) Field of Classification Search
CPC .. H10D 30/014; H10D 30/43; H10D 30/6735; H10D 30/6757; H10D 62/121; H10D 64/017; H10D 84/0167; H10D 84/0177; H10D 84/0181; H10D 84/038; H10D 84/8311; H10D 84/83135; H10D 84/8314; H10D 84/85; H10D 84/851; H10D 88/00; H10D 88/01
See application file for complete search history.

(56) References Cited

U.S. PATENT DOCUMENTS 10,692,866 B2    6/2020  Ando et al.
10,700,064 B1 *  6/2020  Zhang ................... B82Y 10/00
(Continued)

FOREIGN PATENT DOCUMENTS

CN            112687626 A      4/2021

*Primary Examiner* — Shaun M Campbell
(74) *Attorney, Agent, or Firm* — CANTOR COLBURN LLP; Samuel Waldbaum

(57) ABSTRACT
Embodiments of the invention include forming a first transistor having first nanosheets, first dipole gate dielectric material being formed around the first nanosheets. An aspect includes forming a second transistor comprising second nanosheets, second dipole gate dielectric material being formed around the second nanosheets, the first and second transistors being in a vertical stack, a first spacing between the first nanosheets being different from a second spacing between the second nanosheets. An aspect includes forming a workfunction metal stack having a first workfunction metal and a second workfunction metal, the first and second workfunction metals being formed between the first nanosheets, the first workfunction metal being formed to pinch off in the second spacing between the second nanosheets such that the second workfunction metal is absent in the second spacing between the second nanosheets.

20 Claims, 26 Drawing Sheets

(51) Int. Cl.
| | | |
|---|---|---|
| *H10D 30/43* | (2025.01) | |
| *H10D 62/10* | (2025.01) | |
| *H10D 64/01* | (2025.01) | |
| *H10D 84/01* | (2025.01) | |
| *H10D 84/03* | (2025.01) | |
| *H10D 84/85* | (2025.01) | |

(56) References Cited

U.S. PATENT DOCUMENTS

| | | | |
|---|---|---|---|
| 10,991,711 B2 | 4/2021 | Reznicek et al. | |
| 11,315,938 B1 | 4/2022 | Reznicek et al. | |
| 11,502,199 B2 | 11/2022 | Yang et al. | |
| 11,631,671 B2 | 4/2023 | Fulford et al. | |
| 12,009,391 B2 * | 6/2024 | Lee | H10D 30/014 |
| 2020/0020690 A1 * | 1/2020 | Ando | H01L 21/02603 |
| 2020/0294866 A1 * | 9/2020 | Cheng | H10D 30/43 |
| 2022/0199620 A1 * | 6/2022 | Thomas | H10D 64/691 |
| 2022/0310456 A1 | 9/2022 | Hall et al. | |
| 2022/0336680 A1 * | 10/2022 | Wan | H01L 21/02546 |
| 2022/0367520 A1 | 11/2022 | Hong et al. | |
| 2022/0375935 A1 | 11/2022 | Yim et al. | |
| 2022/0415931 A1 * | 12/2022 | Park | H10D 88/00 |
| 2023/0170352 A1 * | 6/2023 | Bao | H10D 84/856 |
| | | | 257/351 |
| 2023/0197814 A1 * | 6/2023 | Xie | H10D 88/01 |
| | | | 257/401 |
| 2024/0213347 A1 * | 6/2024 | Lee | H01L 21/28088 |

* cited by examiner

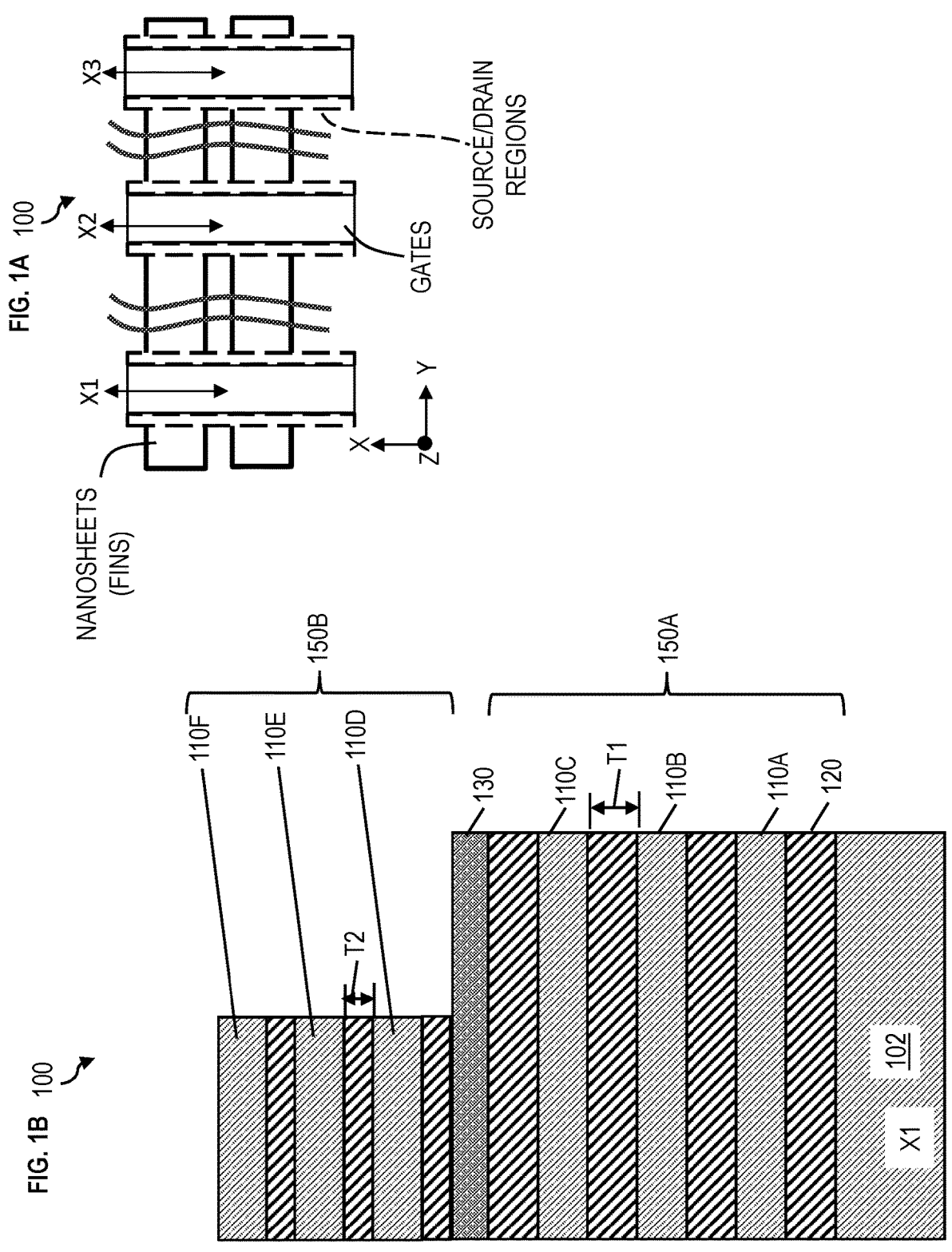

NANOSHEETS (FINS)

SOURCE/DRAIN REGIONS

GATES

X3

X2

X1

110F

110E

110D

150B

130

110C

T1

110B

150A

110A

T2

X1

102

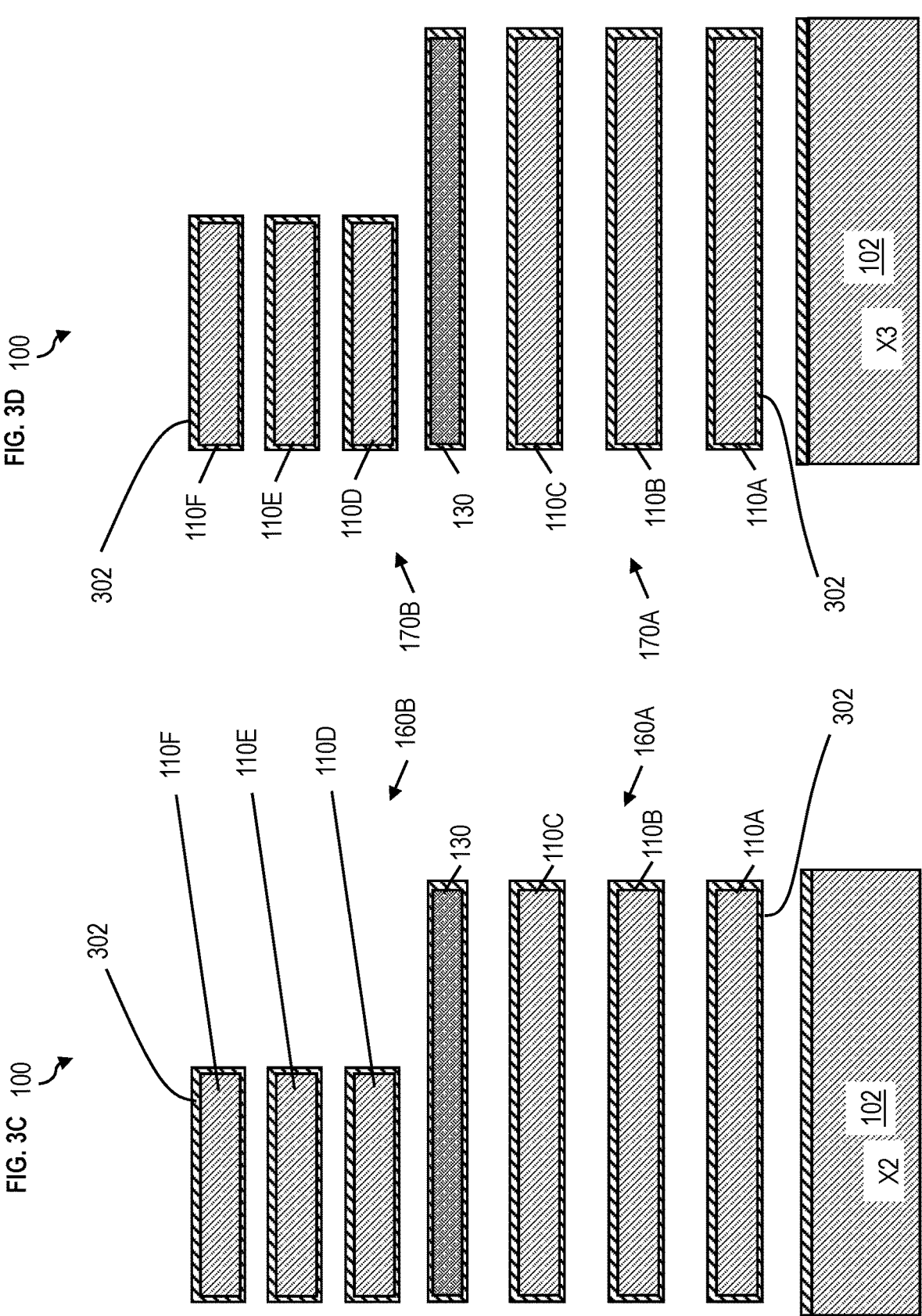

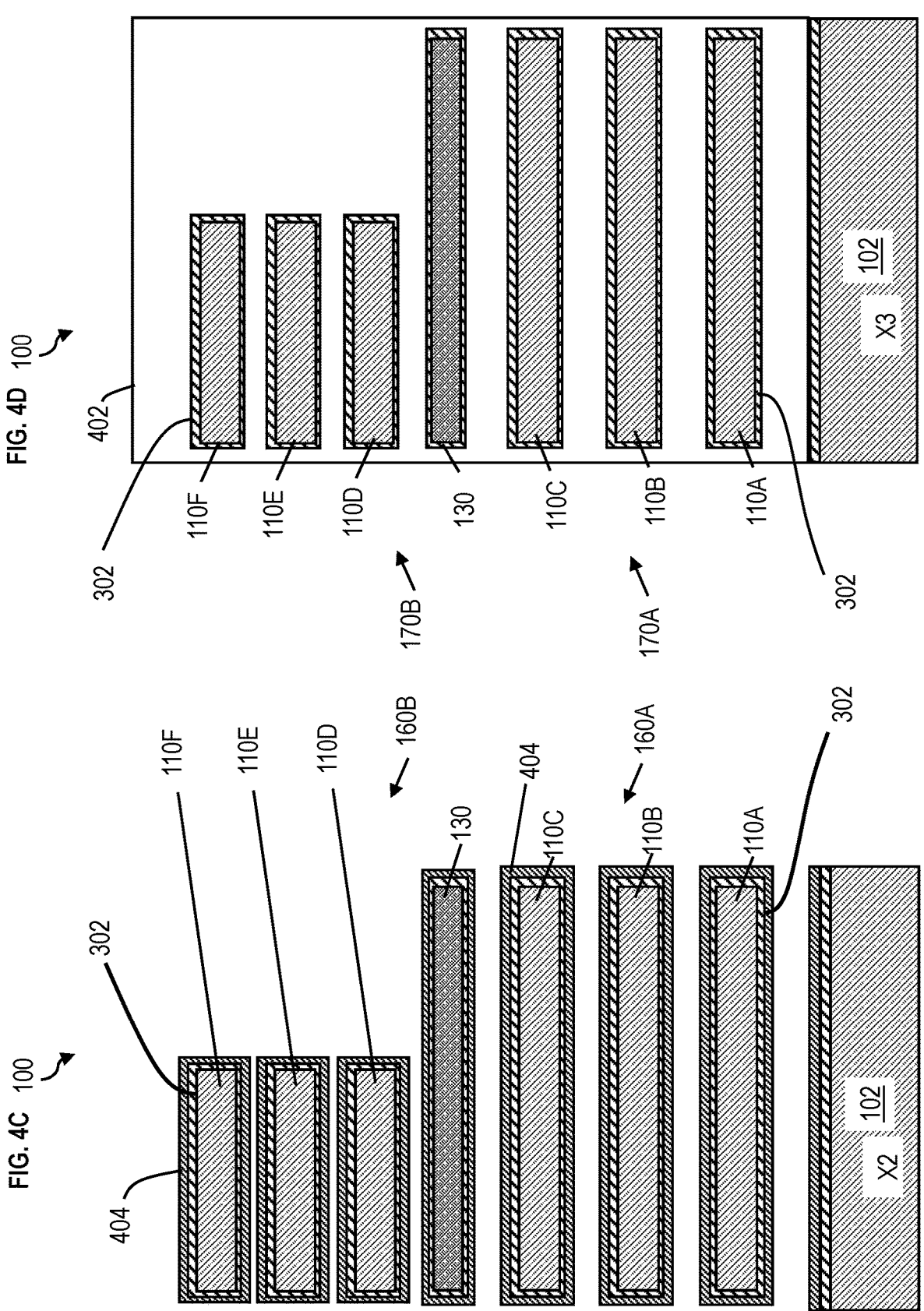

X3

X2

X1

402

302

110F

110E

110D

150B

130

150A

110C

110B

110A

302

102

X1

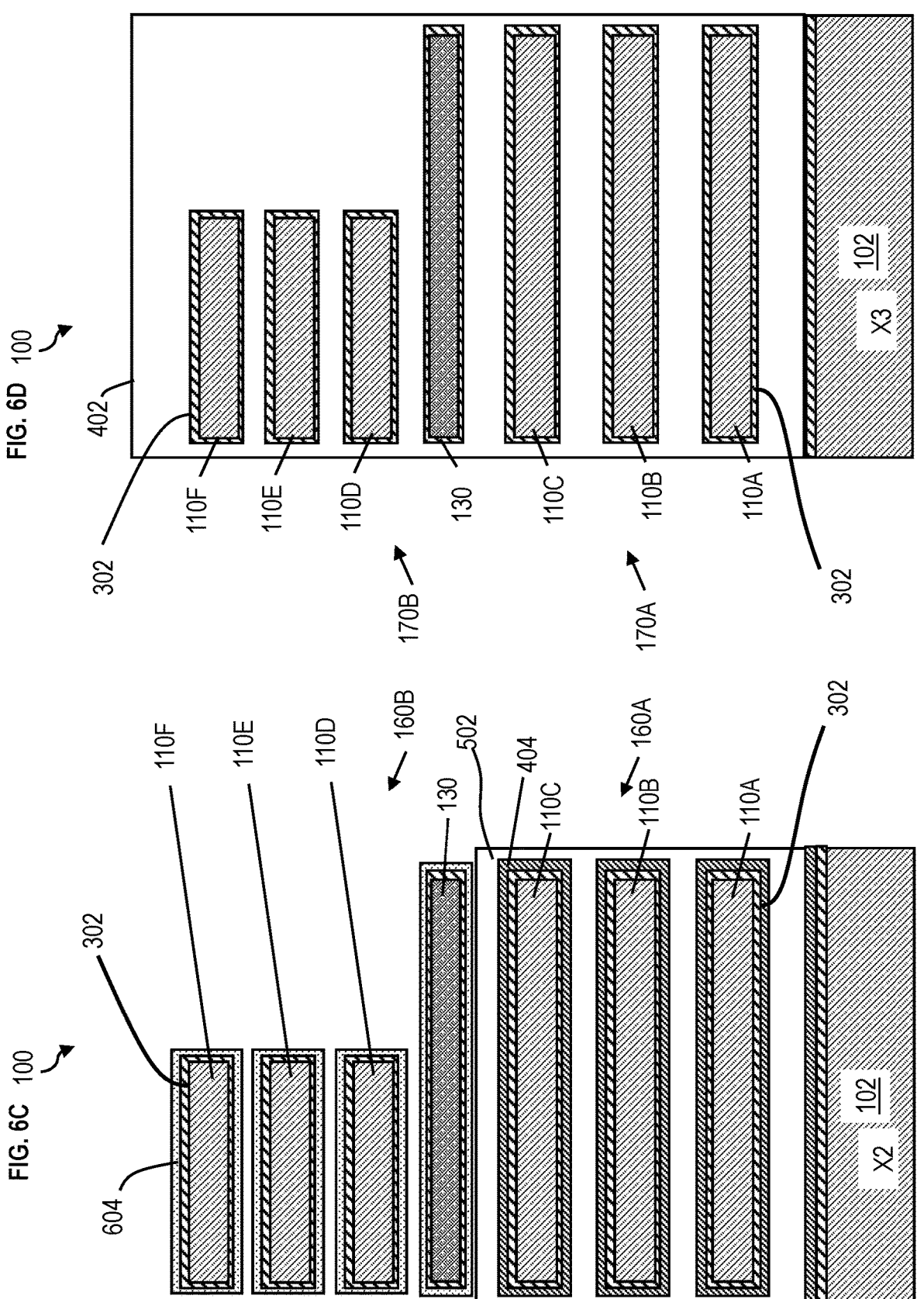

X3

X2

X1

402

302

110F

110E

110D

150B

130

150A

110C

110B

110A

302

102

X1

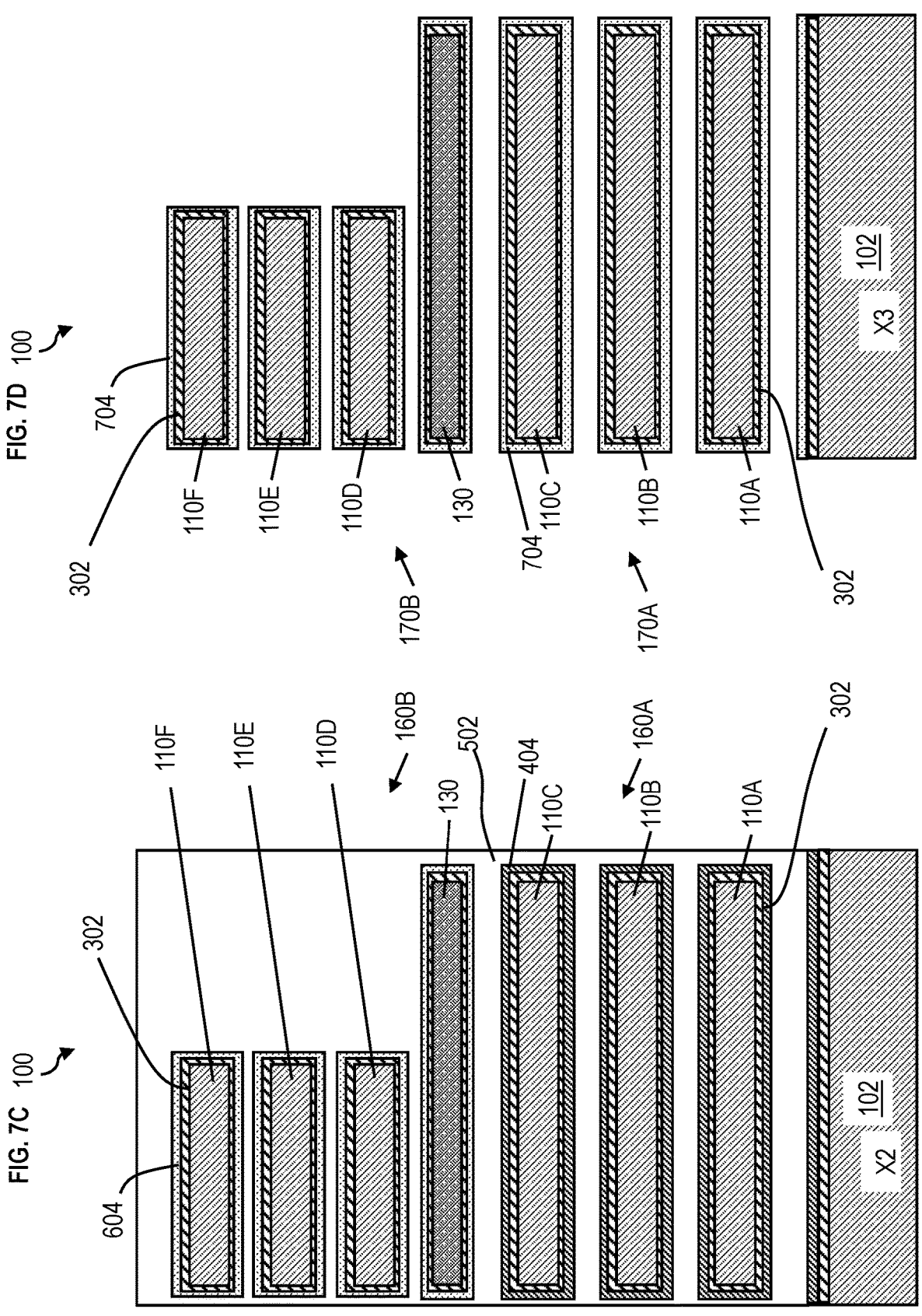

X3

X2

X1

402

302

110F

110E

110D

150B

130

110C

150A

110B

302

110A

102

X1

ANNEAL

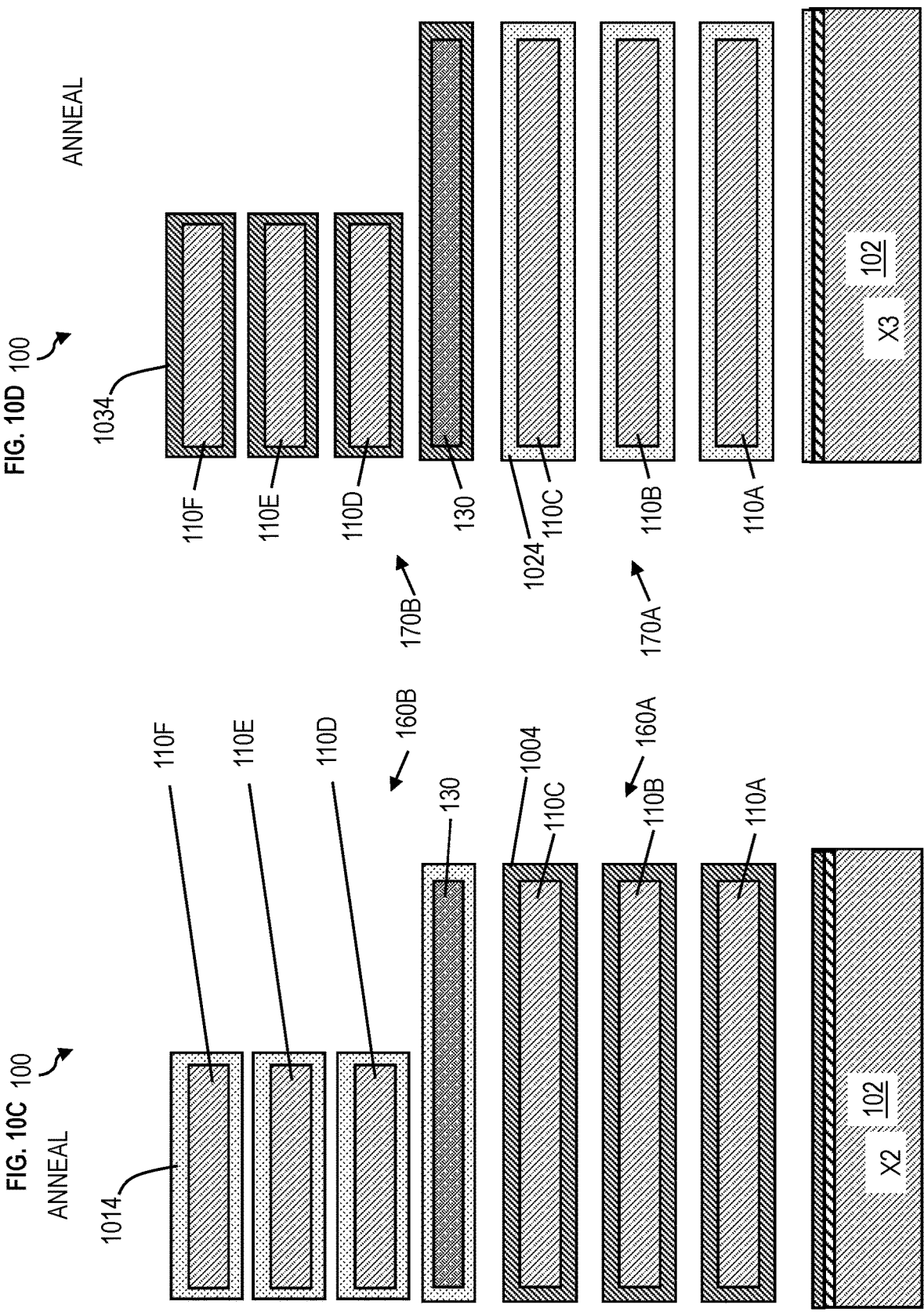

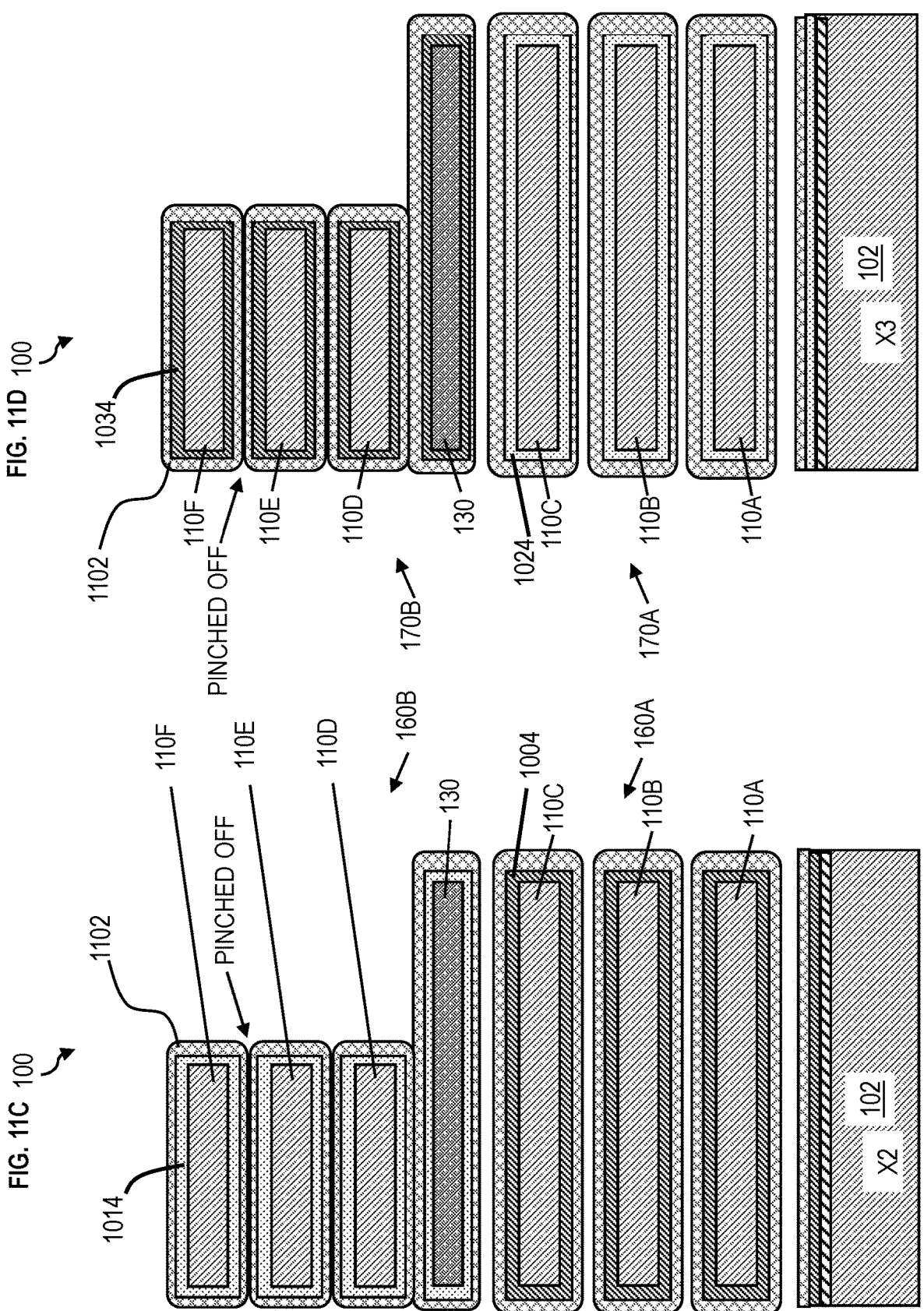

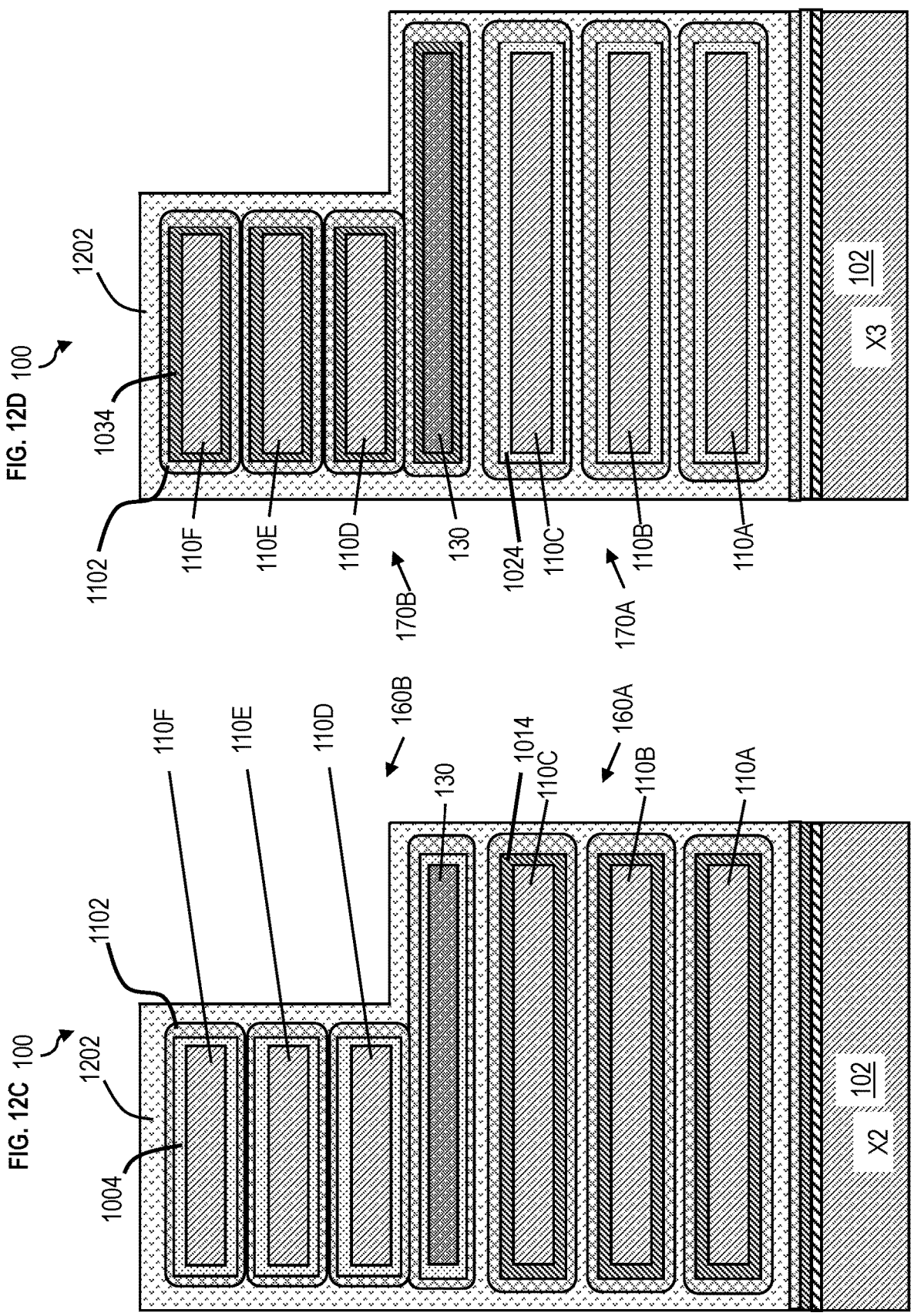

FIG. 13 1300

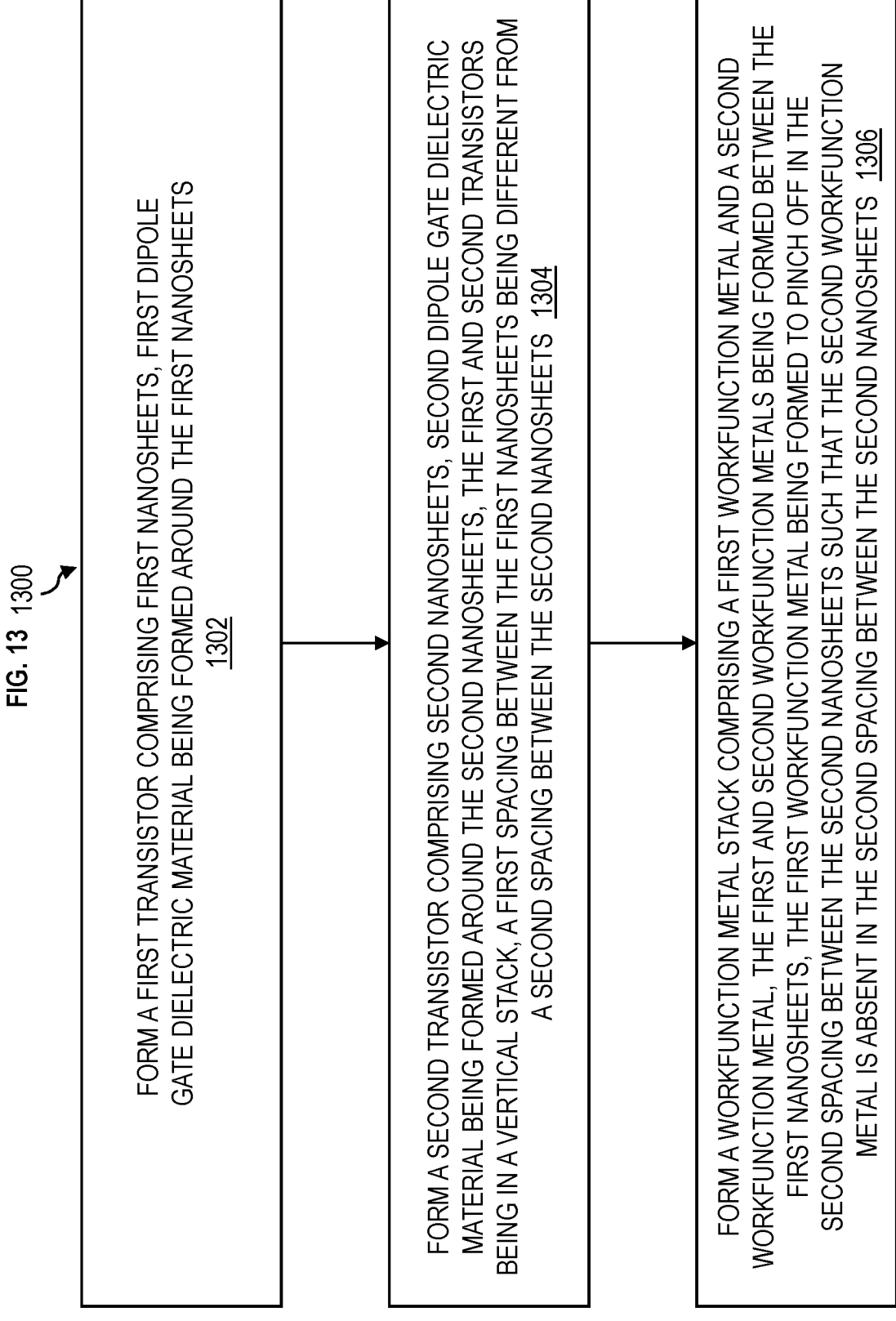

FORM A FIRST TRANSISTOR COMPRISING FIRST NANOSHEETS, FIRST DIPOLE GATE DIELECTRIC MATERIAL BEING FORMED AROUND THE FIRST NANOSHEETS 1302

FORM A SECOND TRANSISTOR COMPRISING SECOND NANOSHEETS, SECOND DIPOLE GATE DIELECTRIC MATERIAL BEING FORMED AROUND THE SECOND NANOSHEETS, THE FIRST AND SECOND TRANSISTORS BEING IN A VERTICAL STACK, A FIRST SPACING BETWEEN THE FIRST NANOSHEETS BEING DIFFERENT FROM A SECOND SPACING BETWEEN THE SECOND NANOSHEETS 1304

FORM A WORKFUNCTION METAL STACK COMPRISING A FIRST WORKFUNCTION METAL AND A SECOND WORKFUNCTION METAL, THE FIRST AND SECOND WORKFUNCTION METALS BEING FORMED BETWEEN THE FIRST NANOSHEETS, THE FIRST WORKFUNCTION METAL BEING FORMED TO PINCH OFF IN THE SECOND SPACING BETWEEN THE SECOND NANOSHEETS SUCH THAT THE SECOND WORKFUNCTION METAL IS ABSENT IN THE SECOND SPACING BETWEEN THE SECOND NANOSHEETS 1306

Figure 14:
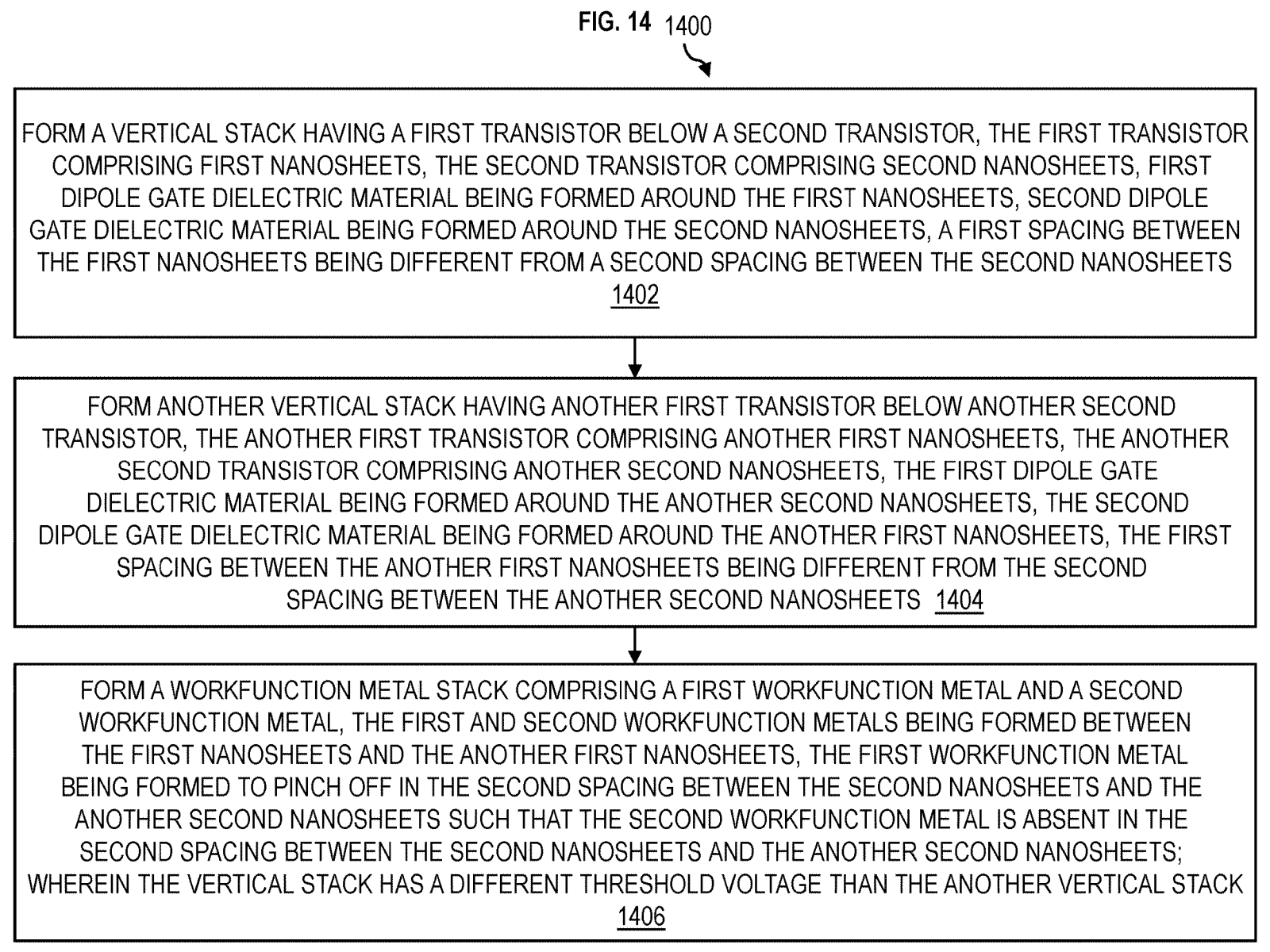

FIG. 14 1400

FORM A VERTICAL STACK HAVING A FIRST TRANSISTOR BELOW A SECOND TRANSISTOR, THE FIRST TRANSISTOR COMPRISING FIRST NANOSHEETS, THE SECOND TRANSISTOR COMPRISING SECOND NANOSHEETS, FIRST DIPOLE GATE DIELECTRIC MATERIAL BEING FORMED AROUND THE FIRST NANOSHEETS, SECOND DIPOLE GATE DIELECTRIC MATERIAL BEING FORMED AROUND THE SECOND NANOSHEETS, A FIRST SPACING BETWEEN THE FIRST NANOSHEETS BEING DIFFERENT FROM A SECOND SPACING BETWEEN THE SECOND NANOSHEETS 1402

FORM ANOTHER VERTICAL STACK HAVING ANOTHER FIRST TRANSISTOR BELOW ANOTHER SECOND TRANSISTOR, THE ANOTHER FIRST TRANSISTOR COMPRISING ANOTHER FIRST NANOSHEETS, THE ANOTHER SECOND TRANSISTOR COMPRISING ANOTHER SECOND NANOSHEETS, THE FIRST DIPOLE GATE DIELECTRIC MATERIAL BEING FORMED AROUND THE ANOTHER SECOND NANOSHEETS, THE SECOND DIPOLE GATE DIELECTRIC MATERIAL BEING FORMED AROUND THE ANOTHER FIRST NANOSHEETS, THE FIRST SPACING BETWEEN THE ANOTHER FIRST NANOSHEETS BEING DIFFERENT FROM THE SECOND SPACING BETWEEN THE ANOTHER SECOND NANOSHEETS 1404

FORM A WORKFUNCTION METAL STACK COMPRISING A FIRST WORKFUNCTION METAL AND A SECOND WORKFUNCTION METAL, THE FIRST AND SECOND WORKFUNCTION METALS BEING FORMED BETWEEN THE FIRST NANOSHEETS AND THE ANOTHER FIRST NANOSHEETS, THE FIRST WORKFUNCTION METAL BEING FORMED TO PINCH OFF IN THE SECOND SPACING BETWEEN THE SECOND NANOSHEETS AND THE ANOTHER SECOND NANOSHEETS SUCH THAT THE SECOND WORKFUNCTION METAL IS ABSENT IN THE ANOTHER SECOND NANOSHEETS AND THE ANOTHER SECOND NANOSHEETS; SECOND SPACING BETWEEN THE SECOND NANOSHEETS AND THE ANOTHER SECOND NANOSHEETS, WHEREIN THE VERTICAL STACK HAS A DIFFERENT THRESHOLD VOLTAGE THAN THE ANOTHER VERTICAL STACK 1406

SINGLE WORK FUNCTION METAL AND MULTIPLE THRESHOLD VOLTAGE SCHEME

BACKGROUND

The present invention generally relates to fabrication methods and resulting structures for integrated circuits (ICs), and more specifically, to fabrication methods and resulting structures for providing a single work function metal multiple threshold voltage scheme for a transistor (FET).

ICs (also referred to as a chip or a microchip) include electronic circuits on a wafer. The wafer is a semiconductor material, such as, for example, silicon or other materials. An IC is formed of a large number of devices, such as transistors, capacitors, resistors, etc., which are formed in layers of the IC and interconnected with wiring in the back-end-of-line (BEOL) layers of the wafer. on the wafer. Typical ICs are formed by first fabricating individual semiconductor devices using processes referred to generally as the front-end-of-line (FEOL). A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of device that shows promise for advanced integrated circuit products of the future is generally known as a nanosheet transistor. In general, a nanosheet transistor has a fin-type channel structure that includes a plurality of vertically spaced-apart sheets of semiconductor material. A gate structure for the device is positioned around each of these spaced-apart layers of channel semiconductor material.

Although nanosheet FET devices are suitable for their intended purposes, what is needed as a stacked nanosheet FET device with different threshold voltages.

SUMMARY

Embodiments of the present invention are directed to providing a single work function metal multiple threshold voltage scheme for a stacked FET. A non-limiting method includes forming a first transistor having first nanosheets, first dipole gate dielectric material being formed around the first nanosheets. The method includes forming a second transistor having second nanosheets, second dipole gate dielectric material being formed around the second nanosheets, the first and second transistors being in a vertical stack, a first spacing between the first nanosheets being different from a second spacing between the second nanosheets. Also, the method includes forming a workfunction metal stack comprising a first workfunction metal and a second workfunction metal, the first and second workfunction metals being formed between the first nanosheets, the first workfunction metal being formed to pinch off in the second spacing between the second nanosheets such that the second workfunction metal is absent in the second spacing between the second nanosheets.

According to one or more embodiments, a non-limiting method includes the method includes forming a vertical stack having a first transistor below a second transistor, the first transistor having first nanosheets, the second transistor comprising second nanosheets, first dipole gate dielectric material being formed around the first nanosheets, second dipole gate dielectric material being formed around the second nanosheets, a first spacing between the first nanosheets being different from a second spacing between the second nanosheets. Also, the method include forming another vertical stack having another first transistor below another second transistor, the another first transistor comprising another first nanosheets, the another second transistor comprising another second nanosheets, the first dipole gate dielectric material being formed around the another second nanosheets, the second dipole gate dielectric material being formed around the another first nanosheets, the first spacing between the another first nanosheets being different from the second spacing between the another second nanosheets. Further, the method includes forming a workfunction metal stack including a first workfunction metal and a second workfunction metal, the first and second workfunction metals being formed between the first nanosheets and the another first nanosheets, the first workfunction metal being formed to pinch off in the second spacing between the second nanosheets and the another second nanosheets such that the second workfunction metal is absent in the second spacing between the second nanosheets and the another second nanosheets. The vertical stack has a different threshold voltage than the another vertical stack.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A, 1B, 1C, and 1D respectively depict a top view and cross-sectional view of a portion of an integrated circuit (IC) under-fabrication after fabrication operations according to one or more embodiments of the invention;

FIGS. 3A, 3B, 3C, and 3D respectively depict a top view and a cross-sectional view of a portion of an IC under-fabrication after fabrication operations according to one or more embodiments of the invention;

FIGS. 4A, 4B, 4C, and 4D respectively depict a top view and a cross-sectional view of a portion of an IC under-fabrication after fabrication operations according to one or more embodiments of the invention;

FIGS. 6A, 6B, 6C, and 6D respectively depict a top view and cross-sectional views of a portion of an IC under-fabrication after fabrication operations according to one or more embodiments of the invention;

FIGS. 7A, 7B, 7C, and 7D respectively depict a top view and cross-sectional views of a portion of an IC under-fabrication after fabrication operations according to one or more embodiments of the invention;

FIGS. 10A, 10B, 10C, and 10D respectively depict a top view and cross-sectional views of a portion of an IC under-fabrication after fabrication operations according to one or more embodiments of the invention;

FIGS. 11A, 11B, 11C, and 11D respectively depict a top view and cross-sectional views of a portion of an IC under-fabrication after fabrication operations according to one or more embodiments of the invention;

FIGS. 12A, 12B, 12C, and 12D respectively depict a top view and cross-sectional view of a portion of an IC under-fabrication after fabrication operations according to one or more embodiments of the invention;

FIG. 13 depicts a flowchart of a method of forming a semiconductor structure according to one or more embodiments of the invention; and FIG. 14 depicts a flowchart of a method of forming a semiconductor structure according to one or more embodiments of the invention.

DETAILED DESCRIPTION

Figures 1C, 1D:
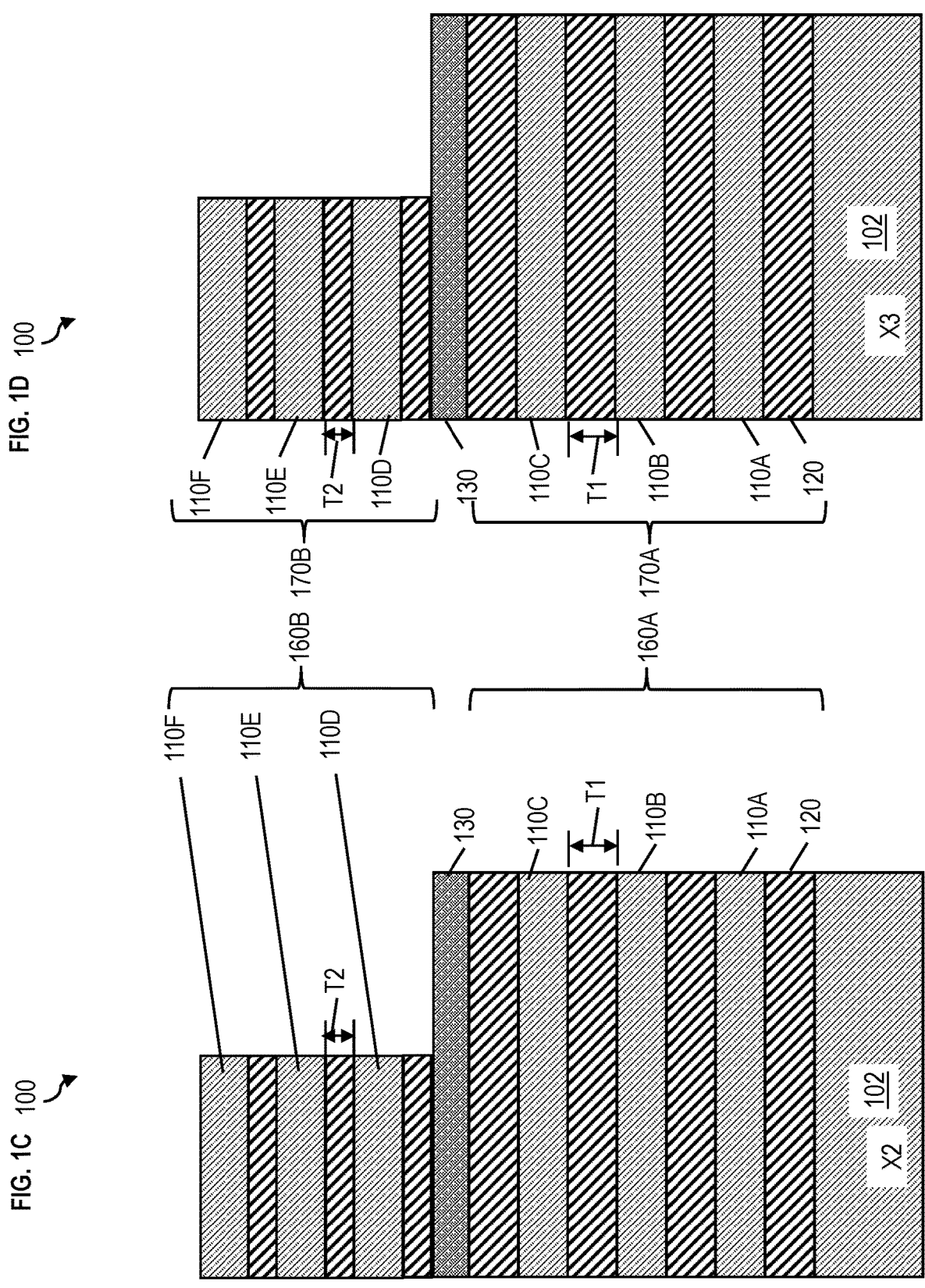
Figures 2A, 2B:
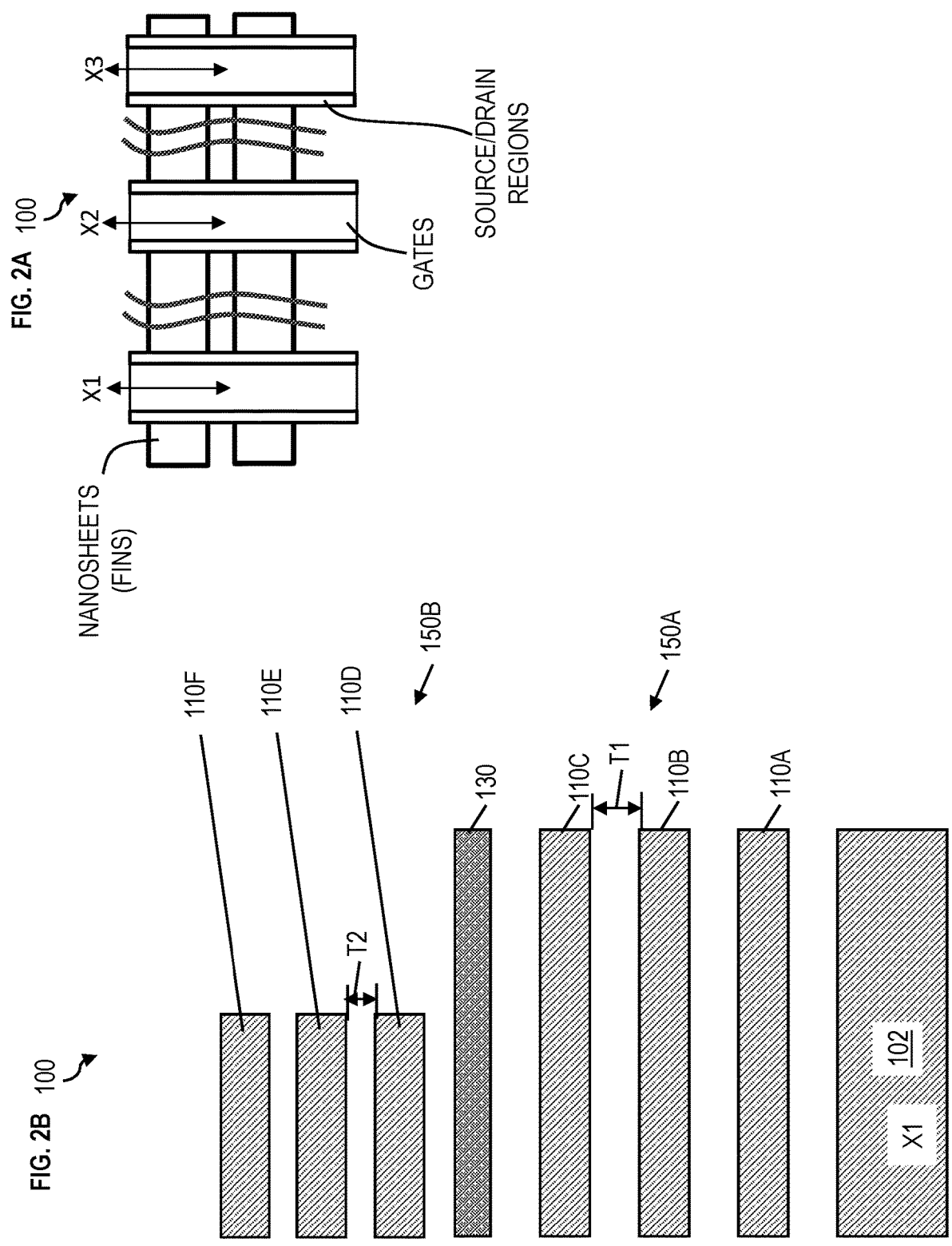
FIGS. 2A, 2B, 2C, and 2D respectively depict a top view and a cross-sectional view of a portion of an IC under-fabrication after fabrication operations according to one or more embodiments of the invention.
Figures 2C, 2D:
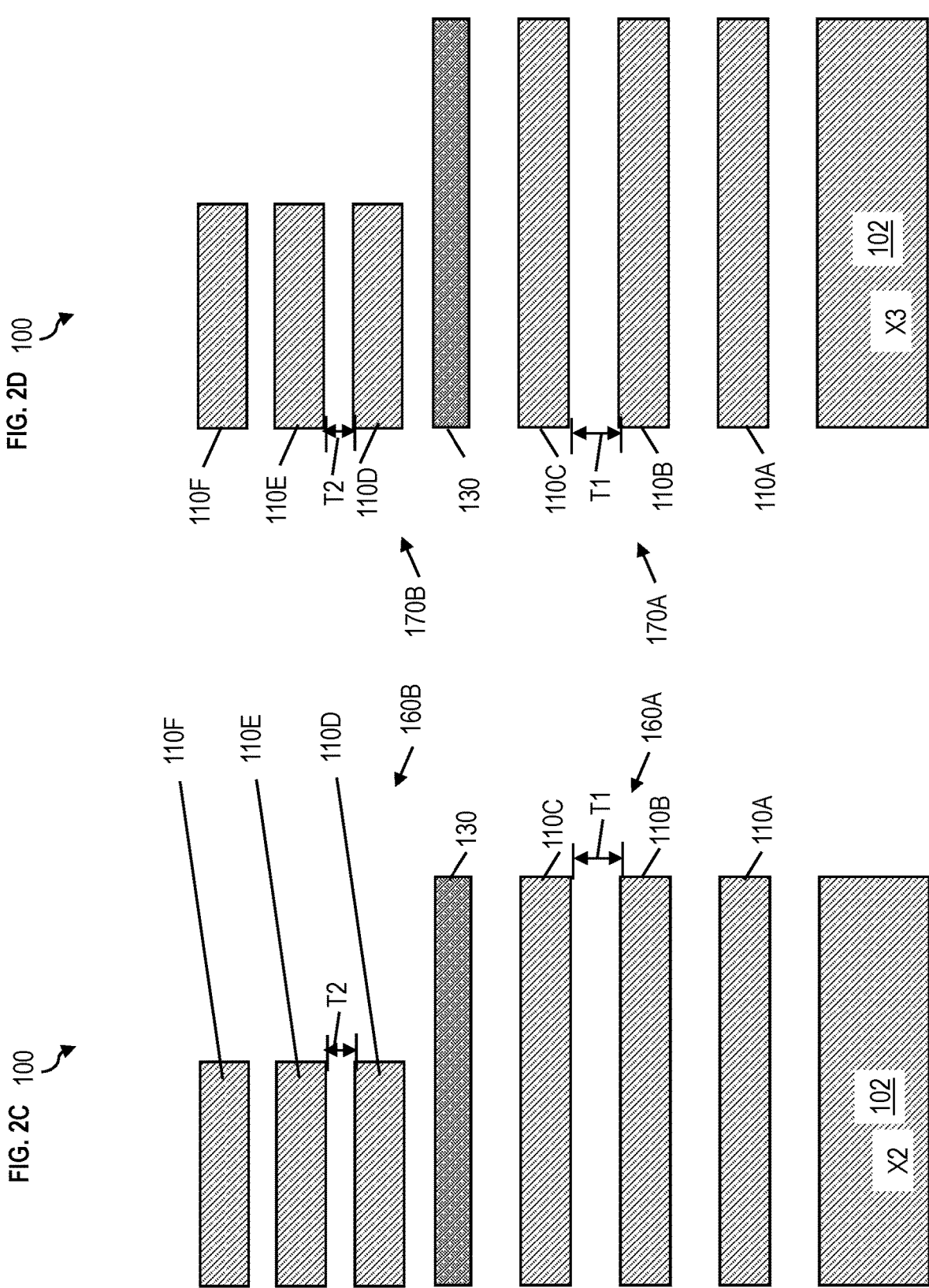
Figure 3A:
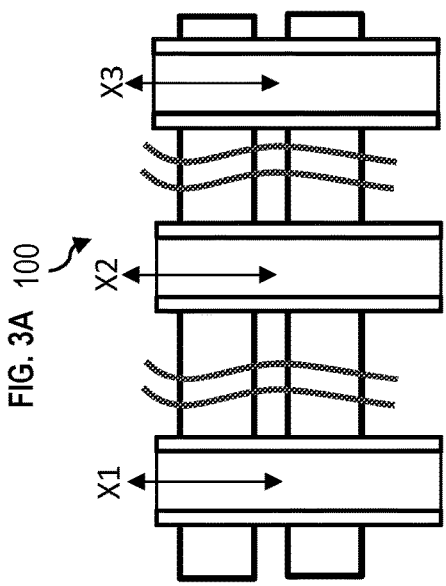
Figure 3B:
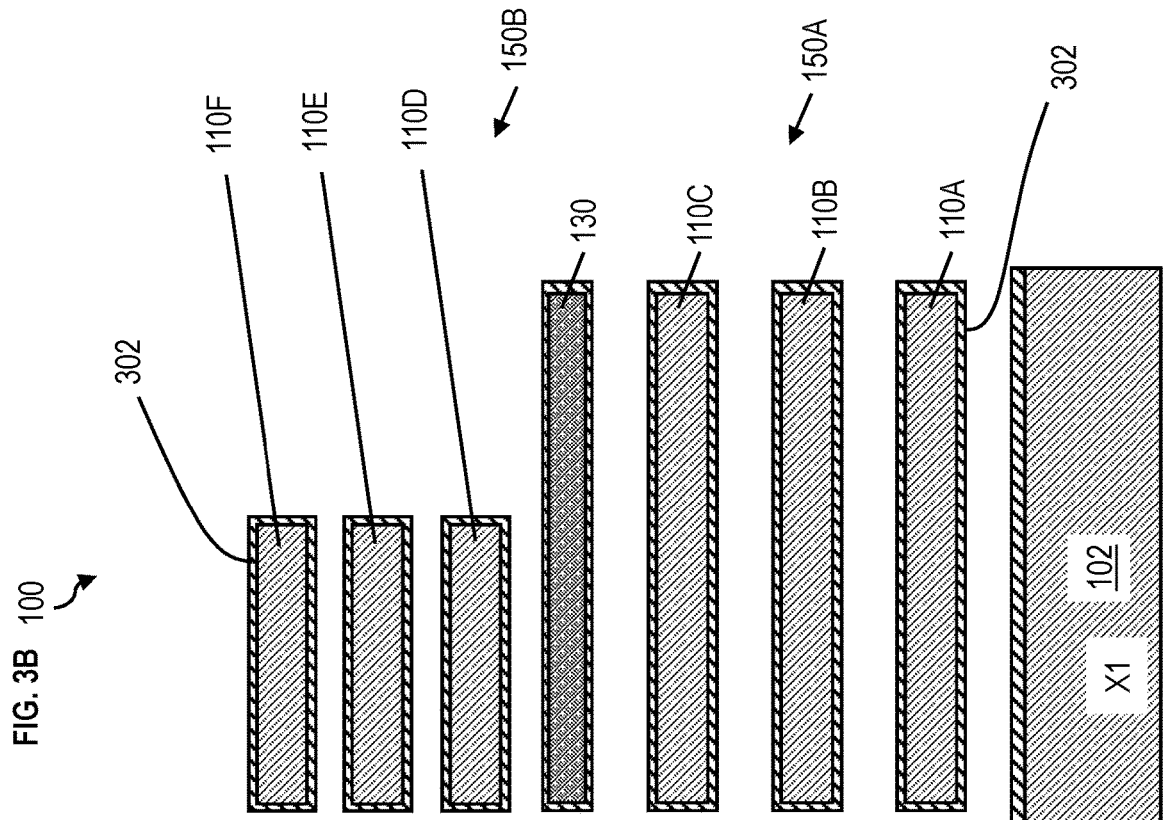

Embodiments of the present invention are directed to providing a single work function metal multiple threshold voltage scheme for a stacked FET. A non-limiting method includes forming a first transistor having first nanosheets, first dipole gate dielectric material being formed around the first nanosheets. The method includes forming a second transistor having second nanosheets, second dipole gate dielectric material being formed around the second nanosheets, the first and second transistors being in a vertical stack, a first spacing between the first nanosheets being different from a second spacing between the second nanosheets. Also, the method includes forming a workfunction metal stack comprising a first workfunction metal and a second workfunction metal, the first and second workfunction metals being formed between the first nanosheets, the first workfunction metal being formed to pinch off in the second spacing between the second nanosheets such that the second workfunction metal is absent in the second spacing between the second nanosheets.

This can provide an improvement over known methods for transistors with threshold voltages because one or more embodiments provide an improved semiconductor structure that is fabricated with no workfunction metal recess to form a vertical stack of an n-type field-effect transistor (NFET) and p-type field-effect transistor (PFET). This significantly simplifies the integration, enables gate height reduction, and provides yield improvement, especially because NFETs and PFETs have different requirements for workfunction metals. One or more embodiments also provide a common metal electrode formed by the first and second workfunction metals without requiring etch back of the first and/or second workfunction metals, and this is because of the different spacings between nanosheets in the NFET and PFET. Multiple vertical stacks of transistors can be currently formed with different threshold voltages by having the first and second dipole gate dielectric materials and by having the first and second spacings between nanosheets in which the second workfunction metal is absent in the second spacing.

In addition to one or more of the features described above or below, additional features include the first and second transistors in the vertical stack are complementary devices in which one is an n-type transistor and another one is a p-type transistor. This advantageously allows complementary devices to be formed in vertical stacks with different threshold voltages.

In addition to one or more of the features described above or below, additional features include one of the first and second dipole gate dielectric materials has a negative polarity and another one has a positive polarity. This advantageously assists with forming vertical stacks with different threshold voltages.

In addition to one or more of the features described above or below, additional features include both the first and second dipole gate dielectric materials have a negative polarity. This advantageously provides flexibility for forming vertical stacks with different threshold voltages.

In addition to one or more of the features described above or below, additional features include both the first and second dipole gate dielectric materials have a positive polarity. This advantageously provides flexibility for forming vertical stacks with different threshold voltages.

In addition to one or more of the features described above or below, additional features include the first transistor is an n-type transistor having the first and second workfunction metals formed between the first nanosheets without requiring etch back of the second workfunction metal on the second transistor. The first workfunction metal is an n-type workfunction metal and the second workfunction metal is a p-type workfunction metal. This advantageously forms the NFET in the vertical stack without requiring etch back of the first and second workfunction metals that could damage the NFET.

In addition to one or more of the features described above or below, additional features include the second transistor is a p-type transistor having the first workfunction metal formed between the second nanosheets without requiring etch back of the second workfunction metal on the second transistor. The first workfunction metal is an n-type workfunction metal and the second workfunction metal is a p-type workfunction metal. This advantageously forms the PFET in the vertical stack without requiring etch back of the first and second workfunction metals that could damage the PFET.

According to one or more embodiments, a non-limiting semiconductor structure includes a first transistor having first nanosheets, first dipole gate dielectric material being formed around the first nanosheets. The semiconductor structure includes a second transistor having second nanosheets, second dipole gate dielectric material being formed around the second nanosheets, the first and second transistors being in a vertical stack, a first spacing between the first nanosheets being different from a second spacing between the second nanosheets. The semiconductor structure includes a workfunction metal stack comprising a first workfunction metal and a second workfunction metal, the first and second workfunction metals being formed between the first nanosheets, the first workfunction metal being formed to pinch off in the second spacing between the second nanosheets such that the second workfunction metal is absent in the second spacing between the second nanosheets.

This can provide an improvement over known semiconductor structures having transistors with threshold voltages because one or more embodiments provide an improved semiconductor structure that is fabricated with no workfunction metal recess to form a vertical stack of an n-type field-effect transistor (NFET) and p-type field-effect transistor (PFET). This significantly simplifies the integration, enables gate height reduction, and provides yield improvement, especially because NFETs and PFETs have different requirements for workfunction metals. One or more embodiments also provide a common metal electrode formed by the first and second workfunction metals without requiring etch back of the first and/or second workfunction metals, and this is because of the different spacings between nanosheets in the NFET and PFET. Multiple vertical stacks of transistors can be currently formed with different threshold voltages by having the first and second dipole gate dielectric materials and by having the first and second spacings between nanosheets in which the second workfunction metal is absent in the second spacing.

According to one or more embodiments, a non-limiting method includes the method includes forming a vertical stack having a first transistor below a second transistor, the first transistor having first nanosheets, the second transistor comprising second nanosheets, first dipole gate dielectric material being formed around the first nanosheets, second dipole gate dielectric material being formed around the second nanosheets, a first spacing between the first nanosheets being different from a second spacing between the second nanosheets. Also, the method include forming another vertical stack having another first transistor below another second transistor, the another first transistor comprising another first nanosheets, the another second transistor comprising another second nanosheets, the first dipole gate dielectric material being formed around the another second nanosheets, the second dipole gate dielectric material being formed around the another first nanosheets, the first spacing between the another first nanosheets being different from the second spacing between the another second nanosheets. Further, the method includes forming a workfunction metal stack including a first workfunction metal and a second workfunction metal, the first and second workfunction metals being formed between the first nanosheets and the another first nanosheets, the first workfunction metal being formed to pinch off in the second spacing between the second nanosheets and the another second nanosheets such that the second workfunction metal is absent in the second spacing between the second nanosheets and the another second nanosheets. The vertical stack has a different threshold voltage than the another vertical stack.

This can provide an improvement over known methods for transistors with threshold voltages because one or more embodiments provide an improved semiconductor structure that is fabricated with no workfunction metal recess to form two vertical stacks of an NFET and PFET. This significantly simplifies the integration, enables gate height reduction, and provides yield improvement, especially because NFETs and PFETs have different requirements for workfunction metals. One or more embodiments also provide a common metal electrode formed by the first and second workfunction metals without requiring etch back of the first and/or second workfunction metals, and this is because of the different spacings between nanosheets in the NFET and PFET. Multiple vertical stacks of transistors can be currently formed with different threshold voltages by having the first and second dipole gate dielectric materials and by having the first and second spacings between nanosheets in which the second workfunction metal is absent in the second spacing.

In addition to one or more of the features described above or below, additional features include the first and second transistors in the vertical stack are complementary devices in which one is an n-type transistor and another one is a p-type transistor, and the another first and another second transistors in the another vertical stack are complementary devices in which one is another n-type transistor and another one is another p-type transistor. This advantageously allows complementary devices to be formed in vertical stacks with different threshold voltages.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The MOSFET is a transistor used for amplifying or switching electronic signals. The MOSFET has a source, a drain, and a metal gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

The nanowire or nanosheet MOSFET is a type of MOSFET that uses multiple stacked nanowires/nanosheets to form multiple channel regions. The gate regions of a nanosheet MOSFET are formed by wrapping gate stack materials around the multiple nanowire/nanosheet channels. This configuration is known as a gate-all-around (GAA) FET structure. The nanowire/nanosheet MOSFET device mitigates the effects of short channels and reduces drain-induced barrier lowering.

The GAA nanosheet FET structures can provide superior electrostatics. In contrast to known Fin-type FET (FinFET) structures in which the fin element of the transistor extends "up" out of the transistor, nanosheet FET designs implement the fin as a silicon nanosheet/nanowire. In a known configuration of a GAA nanosheet FET, a relatively small FET footprint is provided by forming the channel region as a series of nanosheets (i.e., silicon nanowires). A known GAA configuration includes a source region, a drain region, and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

Turning now to a more detailed description of aspects of the present invention, FIG. 1A depicts a top view of a simplified illustration of a portion of an integrated circuit (IC) 100. FIG. 1B depicts a cross-sectional view taken along X1 of the IC 100, FIG. 1C depicts a cross-sectional view taken along X2 of the IC 100, and FIG. 1D depicts a cross-sectional view taken along X3 of the IC 100. For ease of understanding, some layers may be omitted from the various top views so as not to obscure the figure and to view layers underneath. Further, the top view is intended to provide a simplified illustration and a general orientation, but the top view is not intended to be a complete representation of the device. For example, the top view is intended to provide a general orientation of the gates, the nanosheets formed as a fin-like structures, and the locations of source/drain regions. Standard semiconductor fabrication techniques can be utilized to fabricate the IC 100 as understood by one of ordinary skill in the art. Any suitable lithography processes including deposition techniques and etching techniques can be utilized herein.

FIGS. 1A, 1B, 1C, and 1D depict the IC 100 having a wafer where several fabrication processes have been performed. FIGS. 1A, 1B, 1C, and 1D illustrate the IC 100 after nanosheet stack growth and nanosheet patterning into a fin-like structures. A nanosheet stack is formed on a substrate 102. The wafer or substrate 102 may be formed of (pure) silicon. Other suitable materials can be utilized for the substrate 102. A nanosheet stack of semiconductor layers 110A, 110B, and 110C is formed with sacrificial layers 120 formed in between, resulting in a bottom nanosheet FET. The nanosheet stack of semiconductor layers 110D, 110E, and 110F is formed with sacrificial layers 120 formed in between, resulting in an upper nanosheet FET. Each upper nanosheet FET and bottom nanosheet FET form a vertical stack. The upper nanosheet FETs and bottom nanosheet FETs are separated by a middle dielectric isolation layer 130. The middle dielectric isolation layer 130 can be formed of low-k dielectric materials or ultra-low-k dielectric materials. The semiconductor layers 110A, 110B, 110C, 110D, 110E, and 110F can generally be referred to as semiconductor layers 110 and may include substantially pure silicon. The semiconductor layers 110 will become the channel regions for the nanosheet FET device. The semiconductor layers 110 are nanosheets. Nanosheets can have a thickness of, for example, about 5 nanometers. The thickness of a nanosheet can range from about 2-10 nm, and other ranges are possible. The sacrificial layers 120 are formed of silicon germanium (SiGe), where germanium has an atomic percent (%) of about 25% and silicon is the remainder. In one or more embodiments, the atomic percent of germanium can range from about 10-50% while silicon is the remainder in the sacrificial layer 120.

FIG. 1B depicts formation of a bottom nanosheet FET 150A and an upper nanosheet FET 150B with a low threshold voltage (LVt). FIG. 1C depicts formation of a bottom nanosheet FET 160A and an upper nanosheet FET 160B with a regular threshold voltage (RVt). FIG. 1D depicts formation of a bottom nanosheet FET 170A and an upper nanosheet FET 170B with a super low threshold voltage (SLVt). The regular threshold voltage is a greater value than the low threshold voltage, and the low threshold voltage is a greater value than the super low threshold voltage.

As seen in FIGS. 1B, 1C, and 1D, the thickness T1 of the sacrificial layers 120 in the bottom nanosheet FETs 150A, 160A, and 170A is greater than the thickness T2 of the sacrificial layers 120 in the upper nanosheet FETs 150B, 160B, and 170B. The difference in thicknesses T1 and T2 is designed to cause a first workfunction metal (depicted as first workfunction metal 1102 in FIGS. 11A, 11B, 11C, and 11D) to pinch off in the upper nanosheet FETs 150B, 160B, and 170B, while the first workfunction metal is not pinched off in the bottom nanosheet FETs 150A, 160A, and 170A, as discussed further herein. The greater space of the thickness T2 performs both the first workfunction metal and a second workfunction metal to be formed between the nanosheets in the bottom nanosheet FETs 150A, 160A, and 170A. This allows the vertical stacks with the thicknesses T1 and T2 to achieve multiple threshold voltages, where each of the bottom and upper nanosheet FETs has a common metal electrode formed by the first and second workfunction metals in a vertical stack. In one or more embodiments, the thickness T2 of sacrificial layers 120 to form the upper nanosheet FETs can be about 2 nm thinner than the thickness T2 of sacrificial layers 120 to form the bottom nanosheet FETs.

FIGS. 2A, 2B, 2C, and 2D depict the IC 100 after selective removal of the sacrificial layers 120 during channel release. A wet or dry etch can be utilized to selectively remove the sacrificial layers 120, thereby leaving spaces with the thicknesses T1 and T2 for the bottom and upper nanosheet FETs, respectively. Although not shown, inner spacers have been formed between the nanosheets, and source/drain regions have been epitaxially grown from ends of the nanosheets, as understood by one of ordinary skill in the art.

FIGS. 3A, 3B, 3C, and 3D depict the IC 100 after gate dielectric deposition. A gate dielectric material 302 is formed around the semiconductor layers 110 and the middle dielectric isolation layer 130. The gate dielectric material 302 includes a high-k dielectric material. The gate dielectric material 302 may include an interfacial layer formed prior to depositing the high-k dielectric material.

Figure 4A:
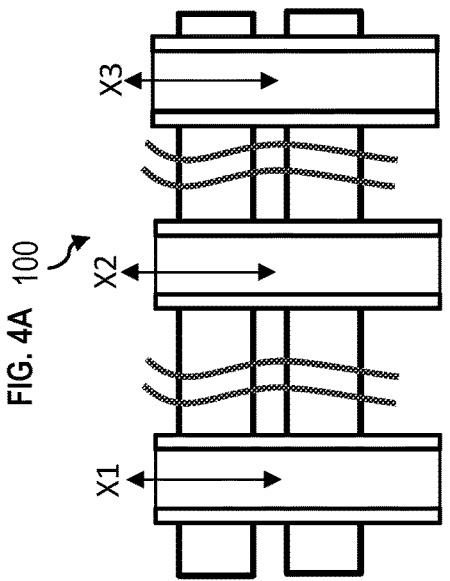
Figure 4B:
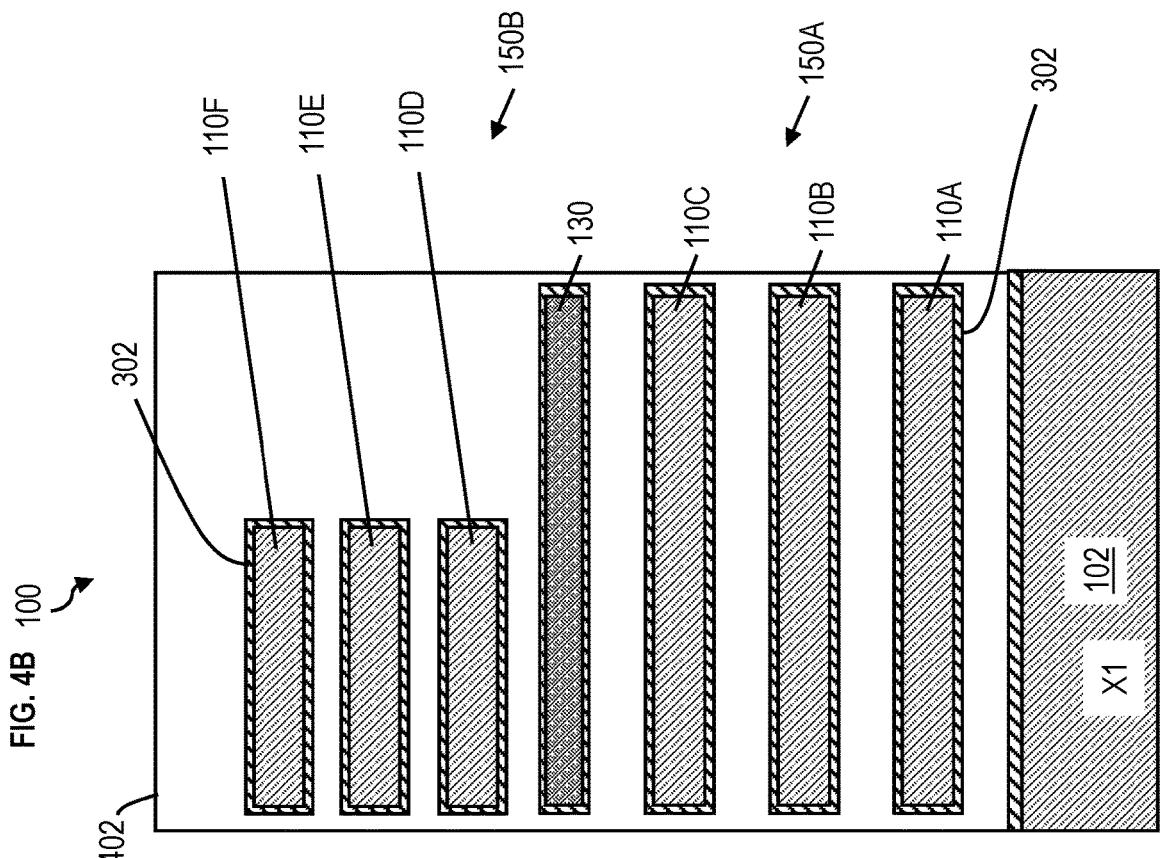

FIGS. 4A, 4B, 4C, and 4D depict the IC 100 after deposition of a dipole material. A mask 402 is formed over the areas protected from dipole deposition. The mask 402 is formed to protect the bottom and upper nanosheet FETs 150A and 150B in FIG. 4B and to protect the bottom and upper nanosheet FETs 170A and 170B in FIG. 4D. The mask 402 can be a stack of materials. The mask 402 can include an organic planarization layer (OPL). In FIG. 4C, dipole material 404 is conformally deposited on the gate dielectric material 302 of the semiconductor layers 110A, 110B, 110C, 110D, 110E, and 110F in the exposed areas. The dipole material 404 is also formed on the middle dielectric isolation layer 130, as depicted in FIG. 4C. The dipole material 404 can be a positive dipole material or a negative dipole material.

As a positive dipole material, the dipole material 404 can be material with a positive charge or positive polarity because of p-type dipole elements. As a negative dipole material, the dipole material 404 can be material with a negative charge or negative polarity because of n-type dipole elements. An example of dipole materials with a positive charge or positive polarity may include lanthanum oxide ($La_2O_3$). An example of dipole materials with a negative charge or negative polarity may include aluminum oxide ($Al_2O_3$).

N-type dipole elements, which are dipole elements having n-type conductivity, decrease a threshold voltage of an n-type transistor and increase an absolute value of a threshold voltage of a p-type transistor by inducing dipoles in the gate dielectric material. P-type dipole elements, which are dipole elements having p-type conductivity, decrease an absolute value of a threshold voltage of a p-type transistor and increase a threshold voltage of an n-type transistor by inducing dipoles in the gate dielectric material.

In an example scenario, the dipole material 404 may be a positive dipole material with a positive charge or positive polarity.

Figure 5A:
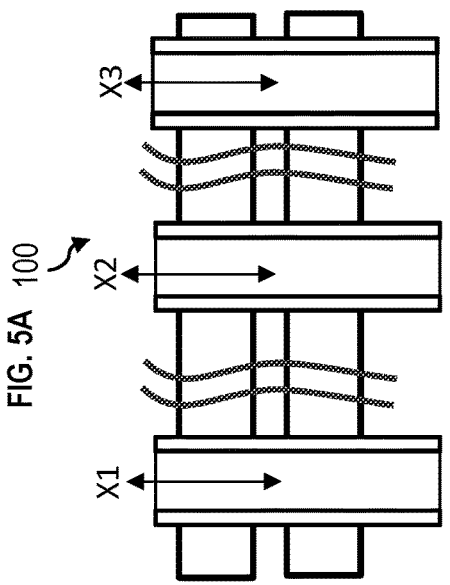
FIGS. 5A, 5B, 5C, and 5D respectively depict a top view and a cross-sectional view of a portion of an IC under-fabrication after fabrication operations according to one or more embodiments of the invention.
Figure 5B:
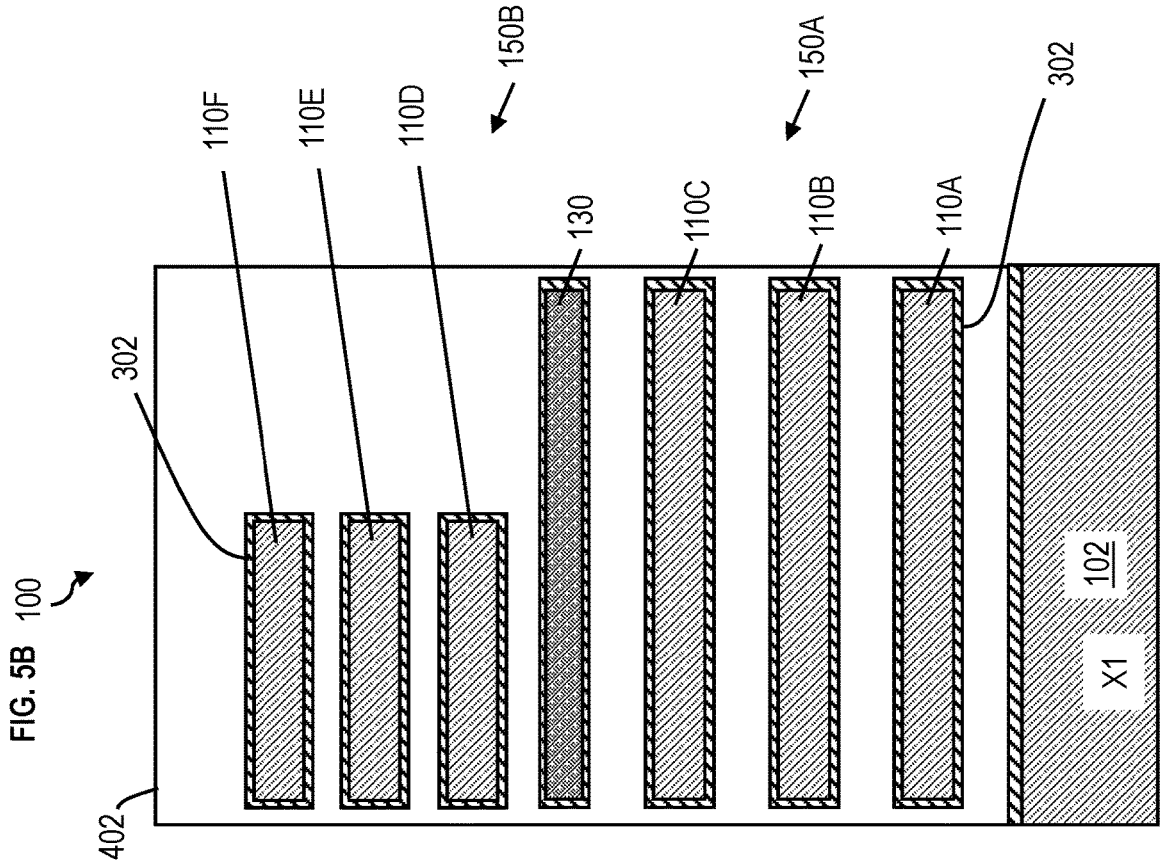
Figures 5C, 5D:
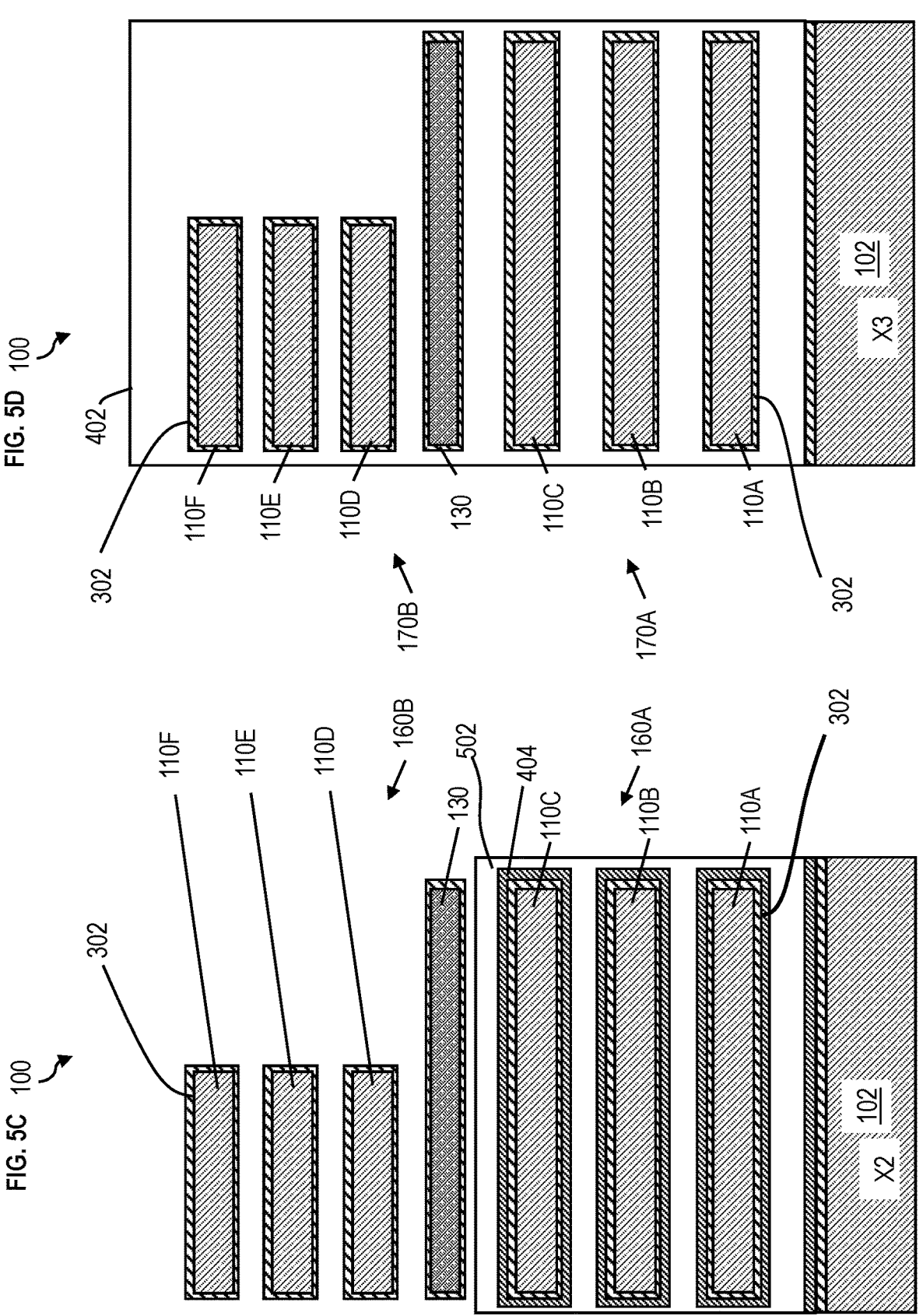

FIGS. 5A, 5B, 5C, and 5D depict the IC 100 after deposition and patterning of a mask. A mask 502 is formed, and patterning is performed to etch back the mask 502 below the middle dielectric interface layer 130 as depicted in FIG. 5C. The mask 502 may include the materials of the mask 402. Photoresist material can be utilized during the patterning of the mask 502. In FIG. 5C, the middle dielectric interface layer 130 and semiconductor layers 110D. 110E, and 110F of the upper nanosheet FET 160B are exposed for further processing, while the bottom nanosheet FET 160A is protected.

Figure 6A:
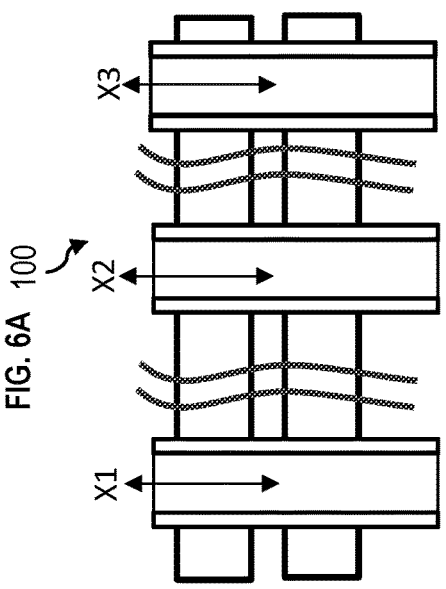
Figure 6B:
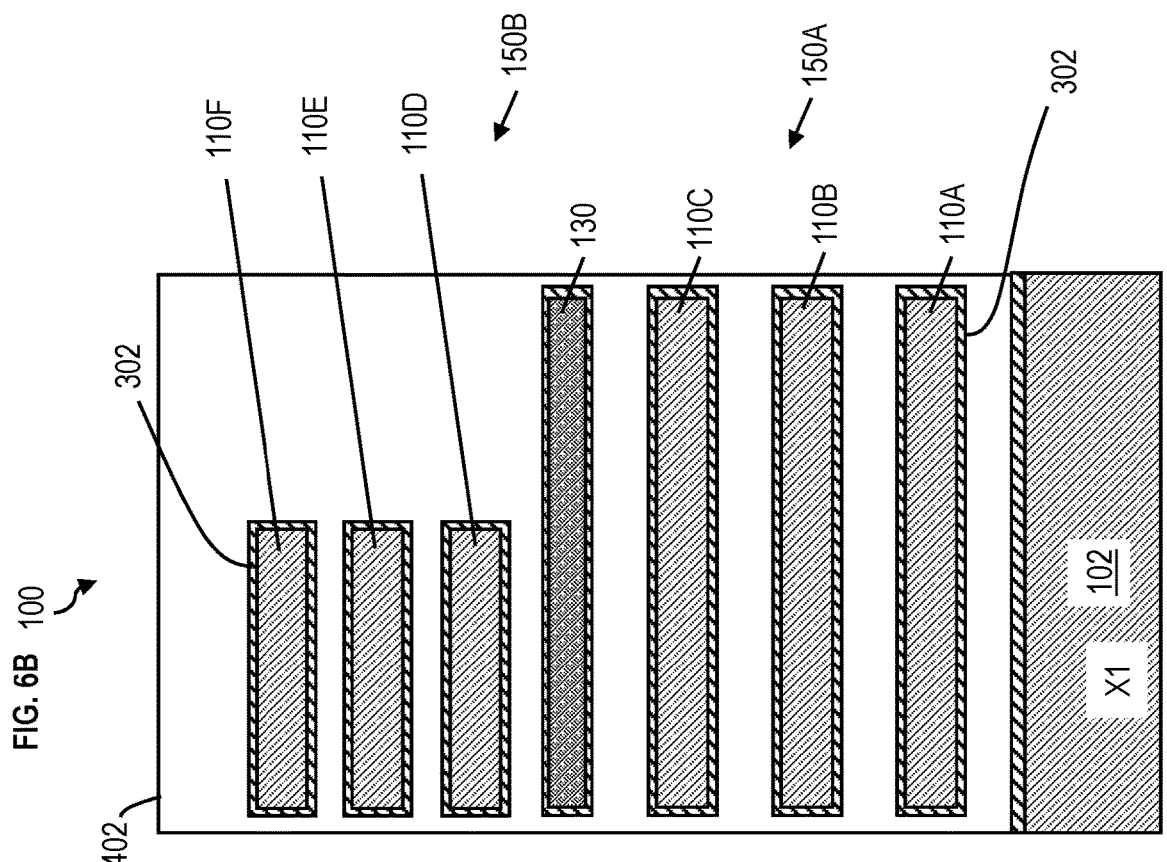

FIGS. 6A, 6B, 6C, and 6D depict the IC 100 after deposition of a dipole material. Dipole material 604 is conformally deposited on the gate dielectric material 302 in the exposed areas. The dipole material 604 can be a positive dipole material or a negative dipole material, as discussed herein. The dipole material 604 is conformally formed on the middle dielectric interface layer 130 and the semiconductor layers 110D. 110E, and 110F of the upper nanosheet FET 160B, as depicted in FIG. 6C. The mask 402 protects bottom and upper nanosheet FETs 150A and 150B as well as bottom and upper nanosheet FETs 170A and 170B.

Following the example scenario, the dipole material 604 can be a negative dipole material with a negative charge or negative polarity. Accordingly, the dipole material 604 of the upper nanosheet FET 160B has an opposite charge or polarity to the dipole material 404 of the bottom nanosheet FET 160A in the example scenario.

Figure 7A:
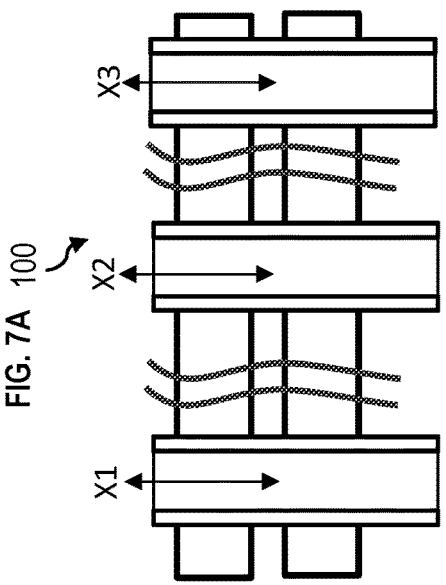
Figure 7B:
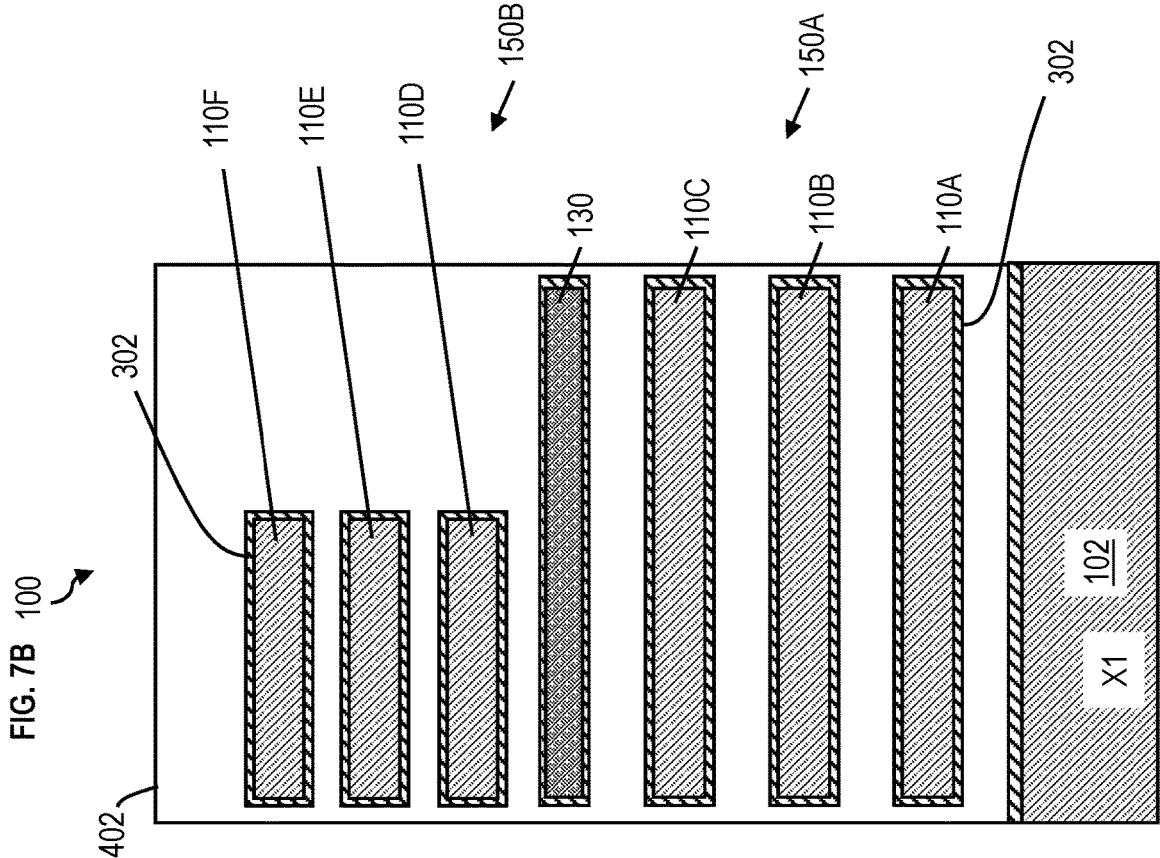

FIGS. 7A, 7B, 7C, and 7D depict the IC 100 after mask removal in a particular area and deposition of dipole material. Additional material of the mask 502 can be formed to fully protect the bottom and upper nanosheet FETs 160A and 160B, as depicted in FIG. 7C. The mask 402 remains on the bottom and upper nanosheet FETs 150A and 150B in FIG. 7B. In preparation for further processing, the mask 402 is removed to expose the bottom and upper nanosheet FETs 170A and 170B in FIG. 7D.

Accordingly, dipole material 704 is conformally deposited on the gate dielectric material 302 in FIG. 7D. The dipole material 704 is formed on the semiconductor layers 110A, 110B, 110C, 110D, 110E, and 110F and the middle dielectric isolation layer 130, as depicted in FIG. 7D. The dipole material 704 can be a positive dipole material or a negative dipole material, as discussed herein. Following the example scenario, the dipole material 704 can be a negative dipole material.

Figure 8A:
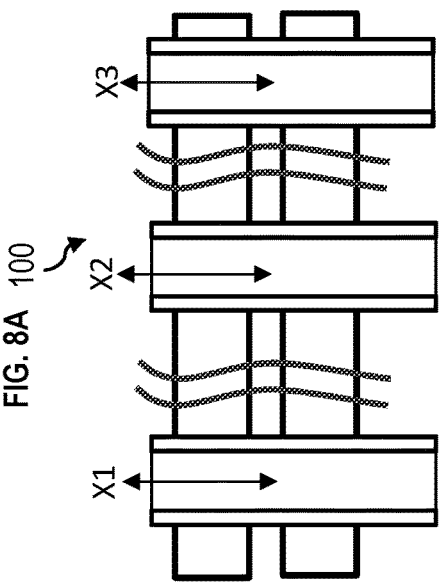
FIGS. 8A, 8B, 8C, and 8D respectively depict a top view and cross-sectional views of a portion of an IC under-fabrication after fabrication operations according to one or more embodiments of the invention.
Figure 8B:
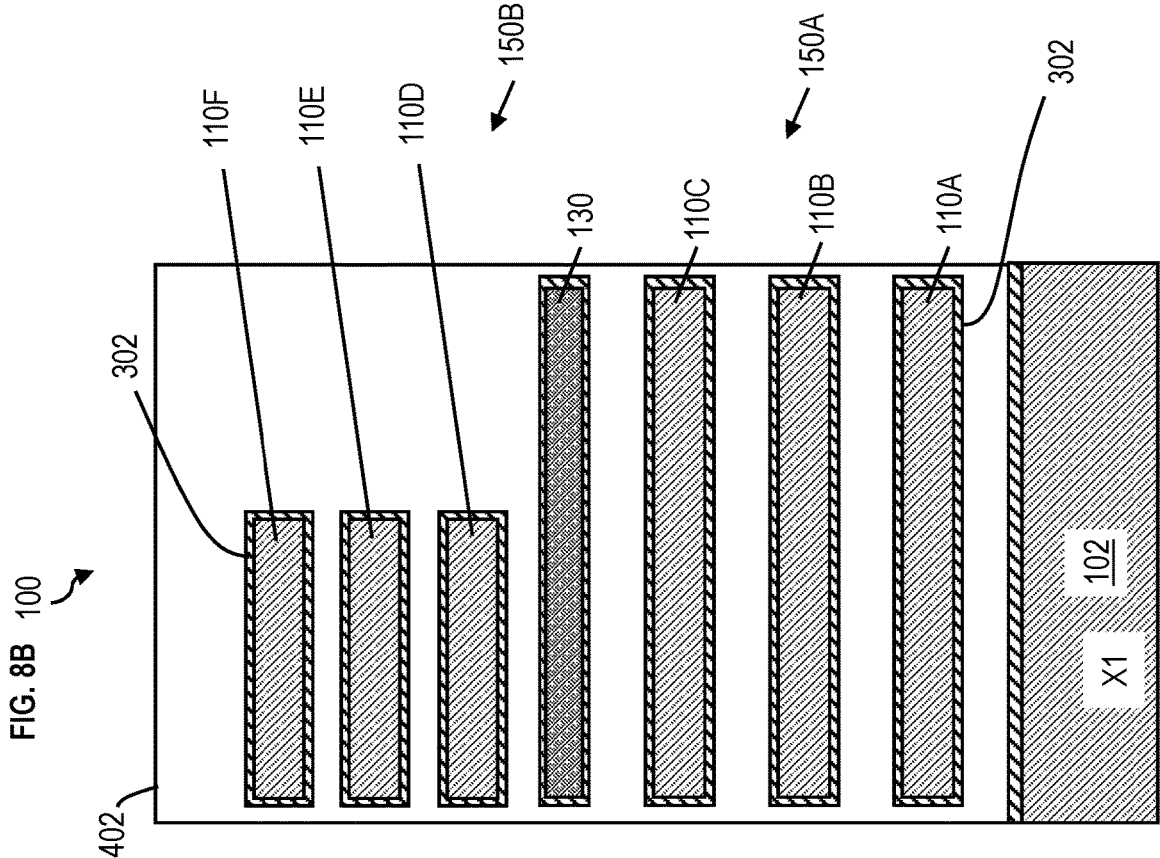
Figures 8C, 8D:
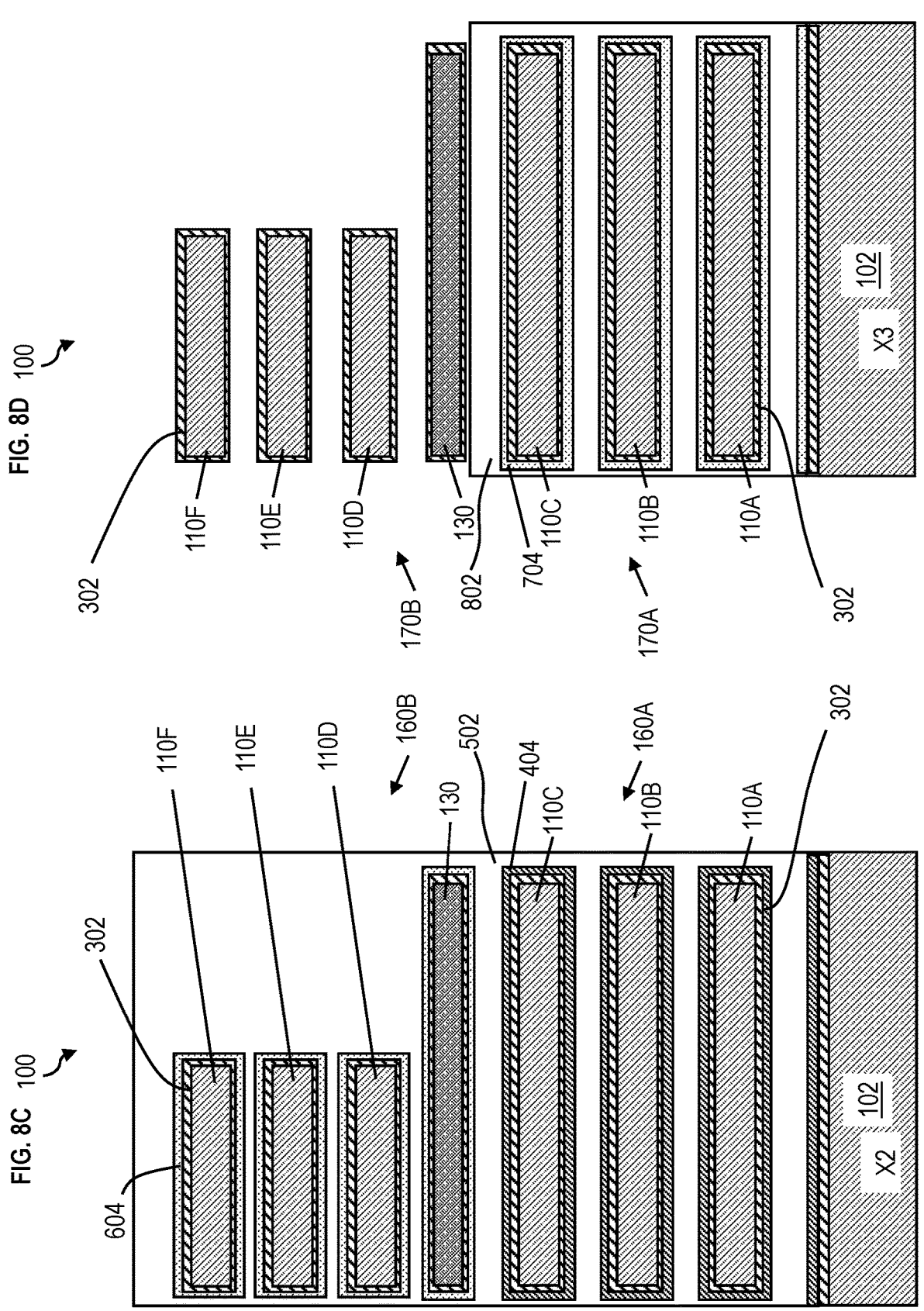

FIGS. 8A, 8B, 8C, and 8D depict the IC 100 after deposition of a mask and patterning of the mask, analogous to FIGS. 5A-5D. A mask 802 is formed, and patterning is performed to etch back the mask 802 below the middle dielectric interface layer 130 as depicted in FIG. 8D. The mask 802 may include the materials of the masks 402 and 502. Photoresist material can be utilized during the patterning of the mask 802. In FIG. 8D, the middle dielectric interface layer 130 and semiconductor layers 110D, 110E, and 110F of the upper nanosheet FET 170B are exposed for further processing, while the bottom nanosheet FET 170A is protected.

Figure 9A:
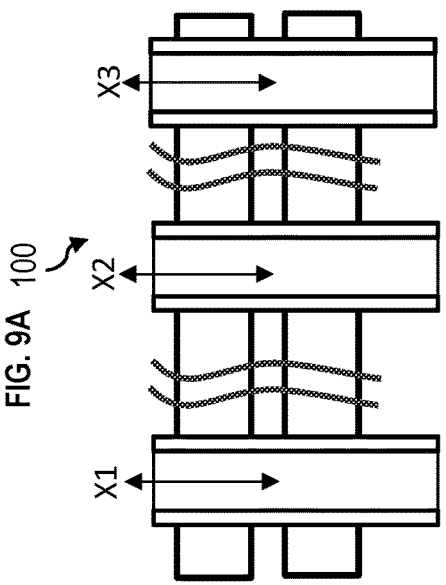
FIGS. 9A, 9B, 9C, and 9D respectively depict a top view and cross-sectional views of a portion of an IC under-fabrication after fabrication operations according to one or more embodiments of the invention.
Figure 9B:
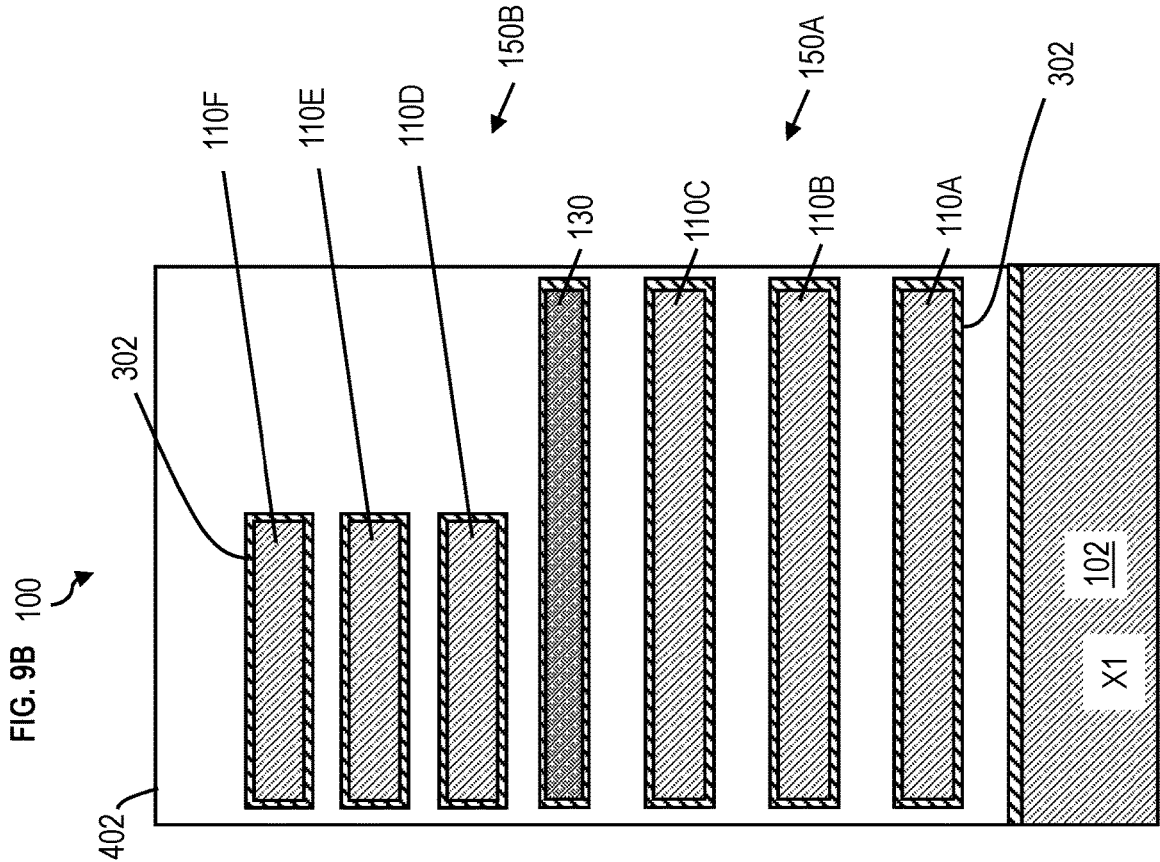
Figures 9C, 9D:
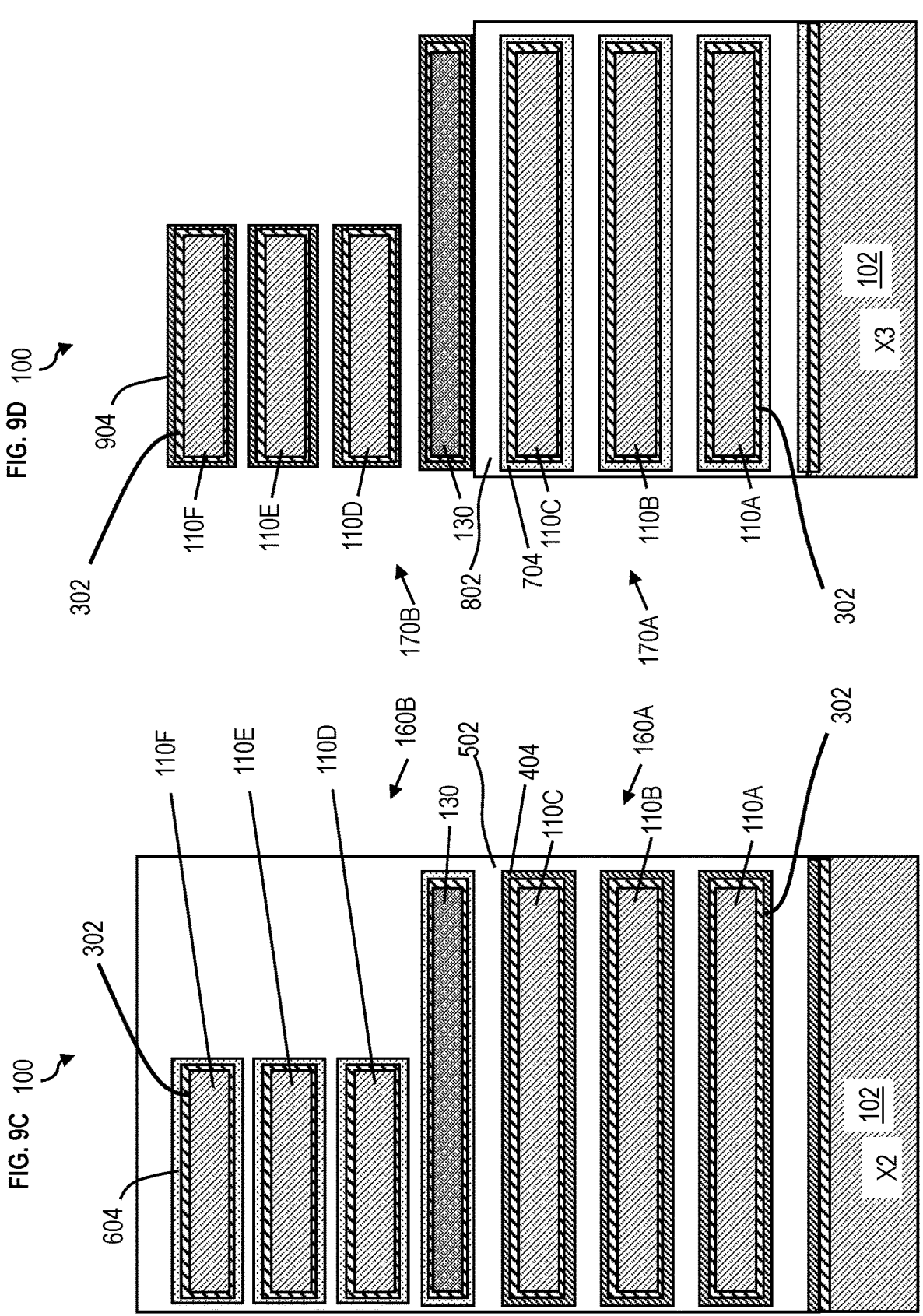

FIGS. 9A, 9B, 9C, and 9D depict the IC 100 after deposition of a dipole material. Dipole material 904 is conformally deposited on the gate dielectric material 302 in the exposed areas. The dipole material 904 can be a positive dipole material or a negative dipole material, as discussed herein. The dipole material 904 is conformally formed on the middle dielectric interface layer 130 and the semiconductor layers 110D, 110E, and 110F of the upper nanosheet FET 170B, as depicted in FIG. 9D. The mask 402 protects bottom and upper nanosheet FETs 150A and 150B during deposition of the dipole material 904, while the mask 502 protects bottom and upper nanosheet FETs 170A and 170B.

Continuing the example scenario, the dipole material 904 can be a positive dipole material with a positive charge or positive polarity. Accordingly, the dipole material 904 of the upper nanosheet FET 170B has the opposite charge or polarity to the dipole material 704 of the bottom nanosheet FET 170A in the example scenario. Similarly, the dipole material 604 of the upper nanosheet FET 160B has the opposite charge or polarity to the dipole material 404 of the bottom nanosheet FET 160A. In the example scenario, dipole material was not deposited on the semiconductor layers in the bottom and upper nanosheet FETs 150A and 150B.

Figure 10A:
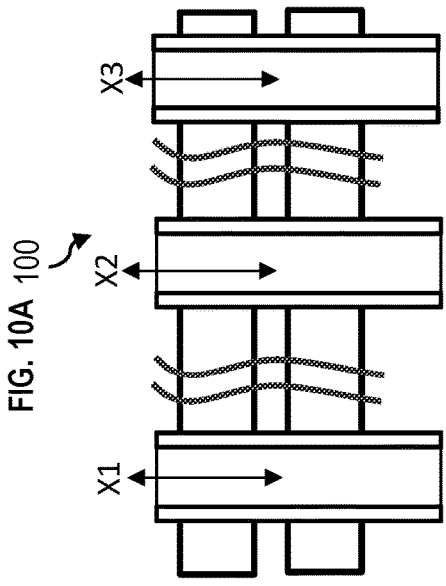
Figure 10B:
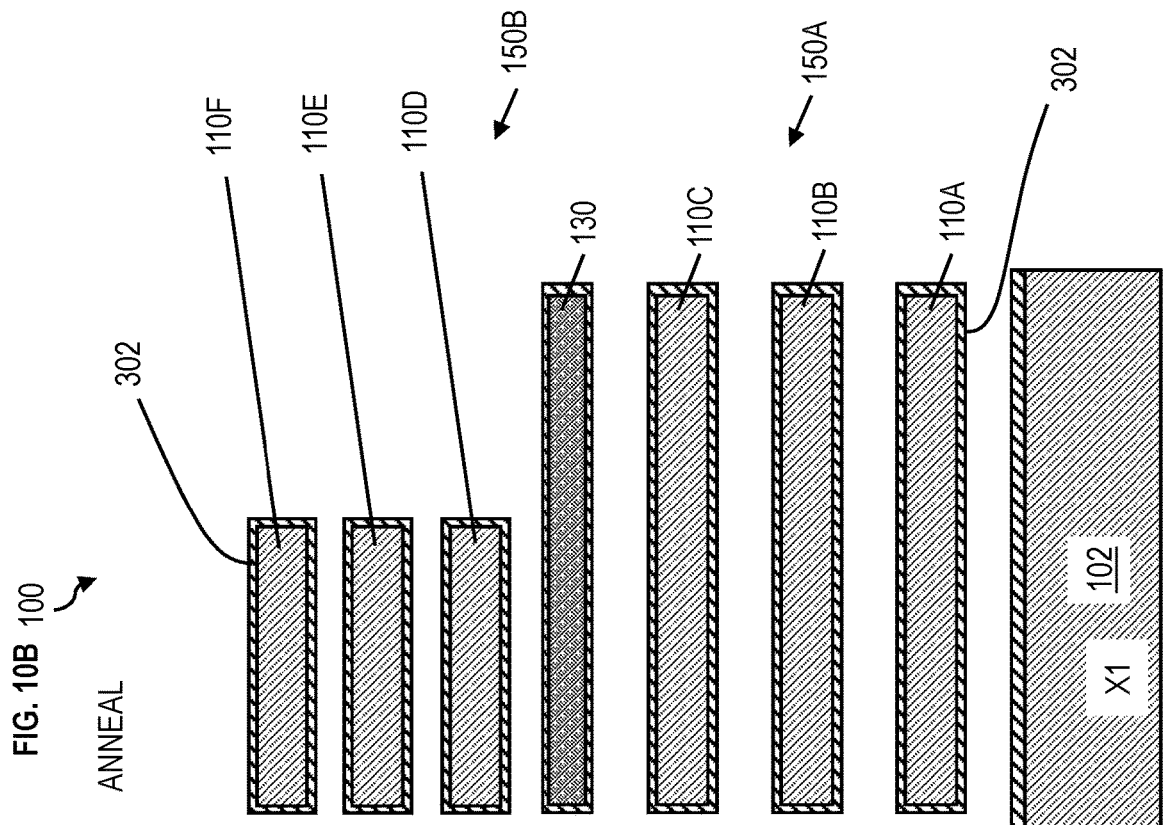

FIGS. 10A, 10B, 10C, and 10D depict the IC 100 after temperature annealing. The annealing drives the dipole elements of the respective dipole materials 404, 604, 704, and 904 into the gate dielectric material 302. As a result, dipole gate dielectric material 1004 is formed in bottom nanosheet FET 160A, dipole gate dielectric material 1014 is formed in upper nanosheet FET 160B, dipole gate dielectric material 1024 is formed in bottom nanosheet FET 170A, and dipole date dielectric material 1034 is formed in upper nanosheet FET 170B, as depicted in FIGS. 10C and 10D, respectively.

FIGS. 11A, 11B, 11C, and 11D depict the IC 100 after first workfunction metal deposition. Deposition of a first workfunction metal 1102 is performed. As discussed earlier, the bottom nanosheet FETs 150A, 160A, and 170A have a distance of the thickness T1 between the semiconductor layers 110A, 110B, and 110C along with the middle dielectric isolation layer 130, which is greater than a distance of the thickness T2 between the semiconductor layers 110D. 110E, and 110F in the upper nanosheet FETs 150B, 160B, and 170B. Because the distance of thickness T2 is less than the distance of thickness T1, the first workfunction metal 1102 pinches off between the semiconductor layers 110A, 110B, and 110C and the middle dielectric isolation layer 130. Particularly, the first workfunction metal 1102 fills the space between the semiconductor layers 110A, 110B, and 110C, and the middle dielectric isolation layer 130. In contrast, space remains after forming the first workfunction metal 1102 around the semiconductor layers 110A. 110B, and 110C, and there is no pinch off of the first workfunction metal 1102 in the bottom nanosheet FETs 150A, 160A, and 170A. This prevents the requirement for etch back of the first workfunction metal and the second workfunction metal.

Figure 12A:
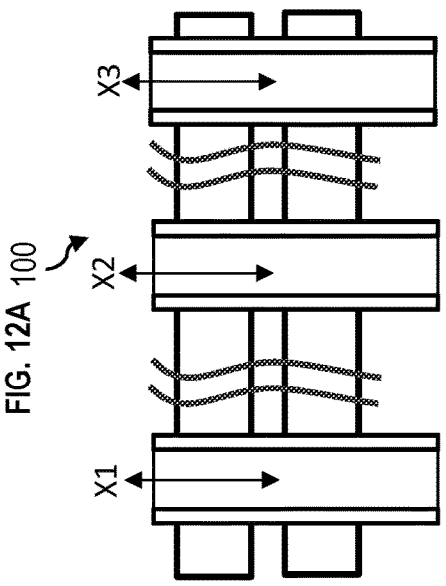

FIGS. 12A. 12B, 12C, and 12D depict the IC 100 after second workfunction metal deposition. Deposition of a second workfunction metal 1202 is performed. The second workfunction metal 1202 is formed between the semiconductor layers 110A, 110B, and 110C as well as the bottom portion of the middle dielectric isolation layer 130.

Because of the first workfunction metal 1102 being pinched off and filling the space between the semiconductor layers 110D, 110E, and 110F in the upper nanosheet FETs, the second workfunction metal 1202 is not formed between the semiconductor layers 110D, 110E, and 110F. Because the thickness T2 is less than the thickness T1, this allows the second workfunction metal 1202 to be deposited without having to etch back the first workfunction metal 1102 and/or without having to etch back the second workfunction metal 1202, thereby reducing the fabrication steps and reducing complexity.

Moreover, the metal gate stack of the first and second workfunction metals 1102 and 1202 forms a single common metal electrode for the bottom and upper nanosheet FET in each respective vertical stack. The metal gate stack is physically and electrically connected for an upper nanosheet FET and a bottom nanosheet FET, thereby resulting in a common metal electrode.

Figure 12B:
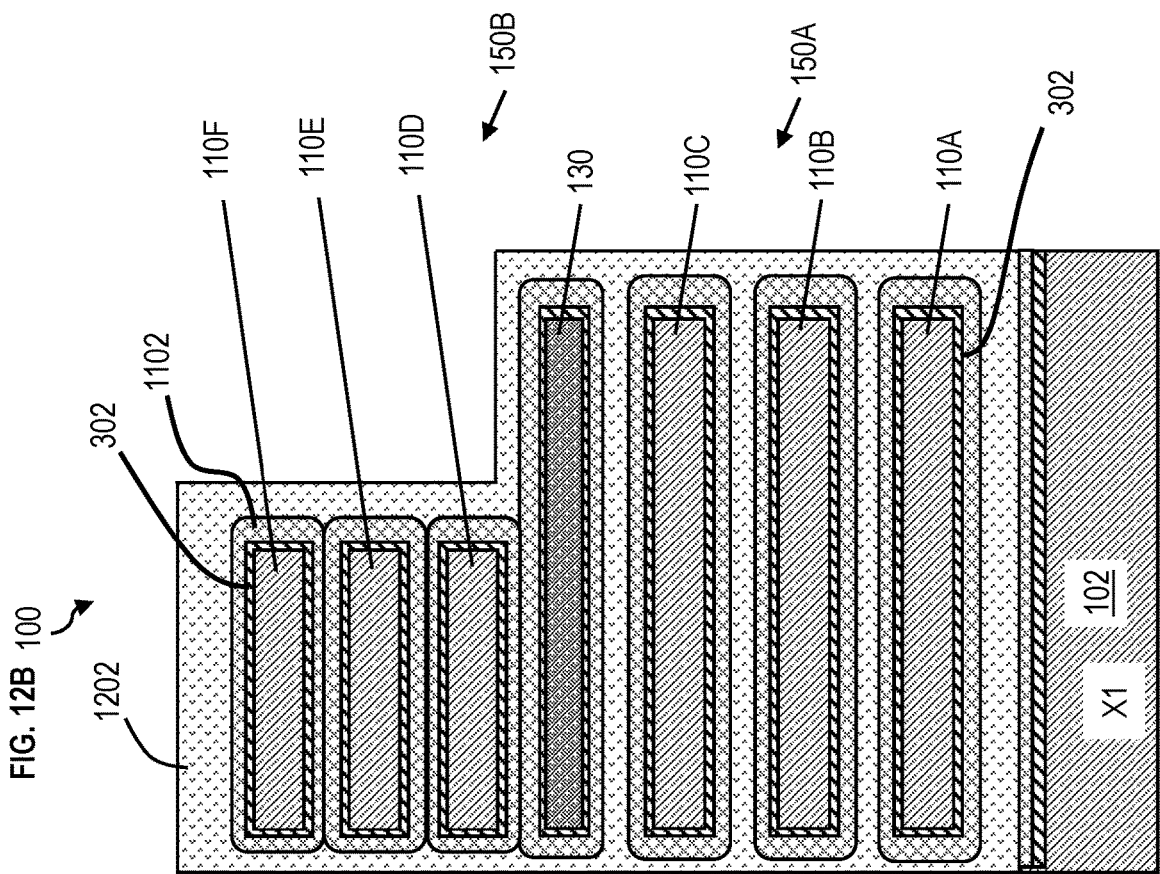

For example, the FET vertical stack has a common metal electrode formed by the first and second workfunction metals 1102 and 1202 for both the bottom nanosheet FET 150A and the upper nanosheet FET 150B as depicted in FIG. 12B; the voltage at the common metal electrode is utilized to power on and power off the bottom nanosheet FET 150A and the upper nanosheet FET 150B, via gate dielectric material 302. Also, the FET vertical stack has a common metal electrode formed by the first and second workfunction metals 1102 and 1202 for both the bottom nanosheet FET 160A and the upper nanosheet FET 160B as depicted in FIG. 12C; the voltage at the common metal electrode is utilized to power on and power off the bottom nanosheet FET 160A and the upper nanosheet FET 160B, via dipole gate dielectric materials 1014 and 1004. Similarly, the FET vertical stack has a common metal electrode formed by the first and second workfunction metals 1102 and 1202 for both the bottom nanosheet FET 170A and the upper nanosheet FET 170B as depicted in FIG. 12D; the voltage at the common metal electrode is utilized to power on and power off the bottom nanosheet FET 170A and the upper nanosheet FET 170B, via dipole gate dielectric materials 1034 and 1024.

Continuing the example scenario, the dipole gate dielectric material 1014 and the dipole gate dielectric material 1034 are the same materials, and the dipole gate dielectric material 1004 and the dipole gate dielectric material 1024 are the same materials. In the example scenario, the bottom nanosheet FETs 150A, 160A, and 170A are p-type transistors, while the upper nanosheet FETs 150B, 160B, and 170B are n-type transistors.

Although the example scenario has been discussed for explanation purposes, embodiments are not meant to be limited. It should be appreciated that any combination of dipole gate dielectric materials can be utilized for various FET vertical stacks. Negative dipole gate dielectric material with a negative charge or polarity can be used for bottom nanosheets and positive dipole gate dielectric material with a positive charge or polarity can be used for upper nanosheets, and vice versa. Negative dipole gate dielectric material with a negative charge or polarity can be used for both the bottom nanosheets and upper nanosheets. Positive dipole gate dielectric material with a positive charge or polarity can be used for both the bottom nanosheets and upper nanosheets.

Although not discussed in detail, it should be appreciated that the nanosheet transistors include inner spacers between semiconductor layers, gate spacers adjacent to the gate dielectric materials, and source/drain regions adjacent to the semiconductor layers in order to provide electrical current through the channel regions. Further, ILD formation and contact formation are performed. ILD material can be deposited, source/drain metal contact openings and gate metal contact openings are patterned by conventional lithography, and then metal is deposited to fill the cavities thereby forming metal contacts. A portion of the metal contacts may include silicide, resulting from the interface of the metal material and semiconductor material. The metal contacts are source/drain contacts that are respectively connected to epitaxial source/drain regions and gate contacts respectively connected to the gates (i.e., the stack of the first and second workfunction metals).

FIG. 13 depicts a computer-implemented method 1300 of forming a semiconductor structure (e.g., IC 100) according to one or more embodiments. Reference can be made to any of the figures discussed herein.

At block 1302, a first transistor (e.g., bottoms nanosheet FETs 150A, 160A, and 170A) comprising first nanosheets (e.g., semiconductor layers 110A, 110B, and 110C) is formed, first dipole gate dielectric material (e.g., dipole gate dielectric material 1014 and 1024) being formed around the first nanosheets.

At block 1304, a second transistor (e.g., upper nanosheet FETs 150B, 160B, 170B) comprising second nanosheets (e.g., semiconductor layers 110D, 110E, and 110F) is formed, second dipole gate dielectric material (e.g., dipole gate dielectric material 1004 and 1034) being formed around the second nanosheets, the first and second transistors being in a vertical stack, a first spacing (e.g., the distance of thickness T1) between the first nanosheets being different from a second spacing (e.g., the distance of thickness T2) between the second nanosheets.

Figure 11A:
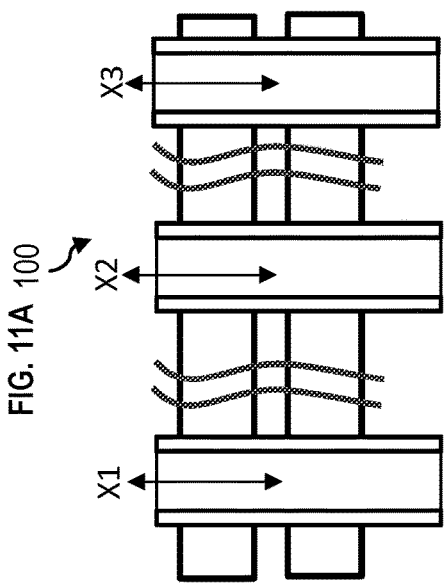
Figure 11B:
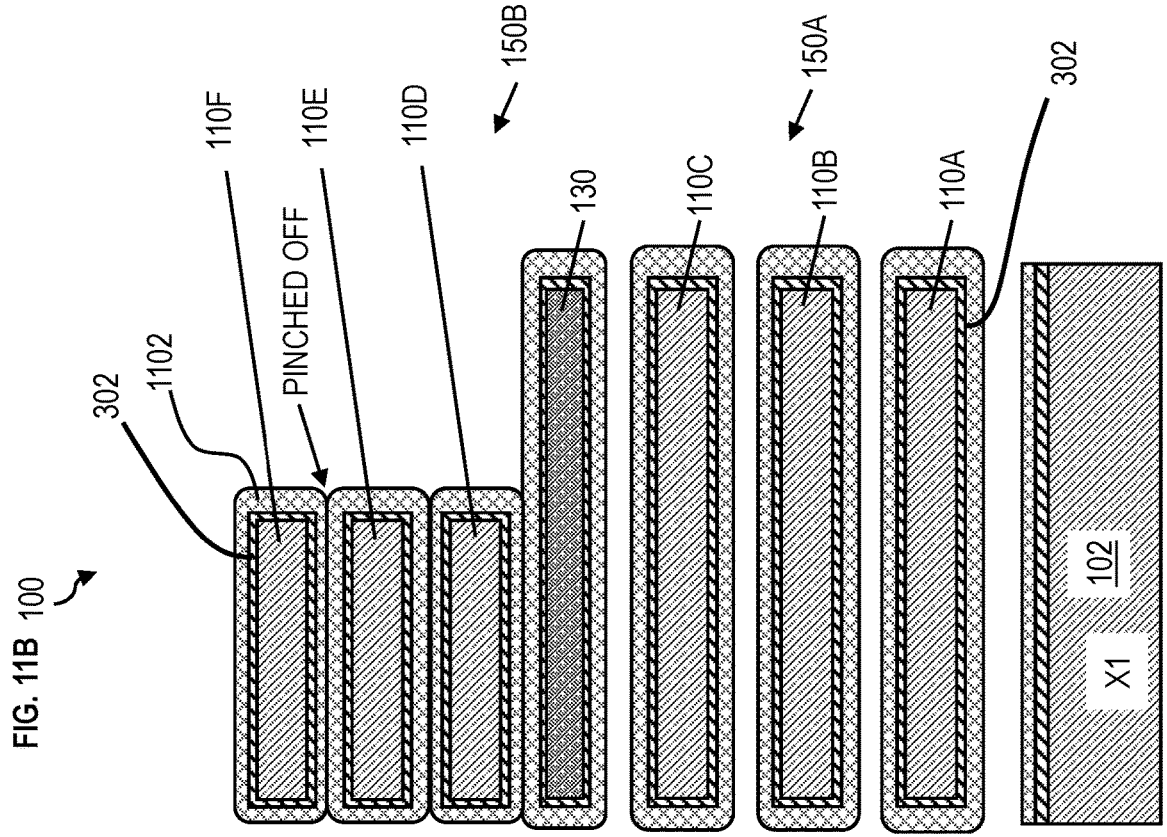

At block 1306, a workfunction metal stack comprising a first workfunction metal 1102 and a second workfunction metal 1202, the first and second workfunction metals being formed between the first nanosheets, the first workfunction metal being formed to pinch off (e.g., as depicted in FIGS. 11B, 11C, and 11D) in the second spacing between the second nanosheets such that the second workfunction metal is absent in the second spacing between the second nanosheets (e.g., semiconductor layers 110D, 110E, and 110F).

The first and second transistors (e.g., bottom and upper nanosheet FETs 150A and 150B, bottom and upper nanosheet FETs 160A and 160B, and bottom and upper nanosheet FETs 170A and 170B) in the vertical stack are complementary devices in which one is an n-type transistor and another one is a p-type transistor. One of the first and second dipole gate dielectric materials (e.g., dipole gate dielectric materials 1004 and 1014, dipole gate dielectric materials 1024 and 1034) has a negative polarity and another one has a positive polarity. Both the first and second dipole gate dielectric materials have a negative polarity. Both the first and second dipole gate dielectric materials have a positive polarity.

The first transistor is an n-type transistor having the first and second workfunction metals formed between the first nanosheets without requiring etch back of the second workfunction metal on the second transistor; the first workfunction metal is an n-type workfunction metal and the second workfunction metal is a p-type workfunction metal. The second transistor is a p-type transistor having the first workfunction metal formed between the second nanosheets without requiring etch back of the second workfunction metal on the second transistor; the first workfunction metal is an n-type workfunction metal and the second workfunction metal is a p-type workfunction metal.

FIG. 14 depicts a computer-implemented method 1400 of forming a semiconductor structure (e.g., IC 100) according to one or more embodiments. Reference can be made to any of the figures discussed herein.

At block 1402, a vertical stack (e.g., depicted in FIG. 12C) having a first transistor below a second transistor is formed (e.g., the bottom nanosheet FET 160A and upper nanosheet FET 160B), the first transistor comprising first nanosheets (e.g., semiconductor layers 110A, 110B, and 110C), the second transistor comprising second nanosheets (e.g., semiconductor layers 110D, 110E, and 110F), first dipole gate dielectric material (e.g., dipole gate dielectric material 1014) being formed around the first nanosheets, second dipole gate dielectric material (e.g., dipole gate dielectric material 1004) being formed around the second nanosheets, a first spacing (e.g., the distance of thickness T1) between the first nanosheets being different from a second spacing (e.g., the distance of thickness T2) between the second nanosheets.

At block 1404, another vertical stack (e.g., depicted FIG. 12D) having another first transistor below another second transistor (e.g., the bottom nanosheet FET 170A and upper nanosheet FET 170B) is formed, the another first transistor comprising another first nanosheets (e.g., semiconductor layers 110A, 110B, and 110C), the another second transistor comprising another second nanosheets (e.g., semiconductor layers 110D, 110E, and 110F), the first dipole gate dielectric material being formed around the another second nanosheets (e.g., dipole gate dielectric material 1034 formed around semiconductor layers 110D, 110E, and 110F depicted in FIG. 12D), the second dipole gate dielectric material being formed around the another first nanosheets (e.g., dipole gate dielectric material 1024 formed around semiconductor layers 110A, 110B, and 110C depicted in FIG. 12D), the first spacing between the another first nanosheets being different from the second spacing between the another second nanosheets.

At block 1406, a workfunction metal stack comprising a first workfunction metal and a second workfunction metal is formed, the first and second workfunction metals being formed between the first nanosheets and the another first nanosheets (e.g., the first and second workfunction metals 1102 and 1202 formed between semiconductor layers 110A, 110B, and 110C as depicted in FIGS. 12C and 12D), the first workfunction metal being formed to pinch off in the second spacing between the second nanosheets and the another second nanosheets such that the second workfunction metal is absent in the second spacing between the second nanosheets and the another second nanosheets (e.g., only the first workfunction metal 1102 formed between semiconductor layers 110D. 110E, and 110F as depicted in FIGS. 12C and 12D). The vertical stack (e.g., depicted in FIG. 12C) has a different threshold voltage than the another vertical stack (e.g., depicted in FIG. 12D).

The gate material includes high-k material deposition and work function material deposition. Gate material is formed around the semiconductor layers. The gate material includes high-k material and work function material generally referred to as a high-k metal gate (HKMG). Techniques for forming HKMG in gate openings are well-known in the art and, thus, the details have been omitted in order to allow the reader to focus on the salient aspects of the disclosed methods. However, it should be understood that such HKMG will generally include formation of one or more gate dielectric layers (e.g., an inter-layer (IL) oxide and a high-k gate dielectric layer), which are deposited so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. To avoid clutter in the drawings and to allow the reader to focus on the salient aspects of the disclosed methods, the different layers within the HKMG stack are not illustrated. For explanation purposes, a high-k gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum, or any other suitable fill metal or fill metal.

Low-k dielectric materials may generally include dielectric materials having a k value of about 3.9 or less. The ultralow-k dielectric material generally includes dielectric materials having a k value less than 2.5. Unless otherwise noted, all k values mentioned in the present application are measured relative to a vacuum. Exemplary ultra-low-k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultra-low-k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low-k dielectric films can be formed by hydrolysis and polycondensation of an alkoxide(s) such as tetraetehoxysilane (TEOS).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of #8% or 5%, or 2% of a given value.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
forming a first transistor comprising first nanosheets, first dipole gate dielectric material being formed around the first nanosheets;
forming a second transistor comprising second nanosheets, second dipole gate dielectric material being formed around the second nanosheets, the first and second transistors being in a vertical stack, a first spacing between the first nanosheets being different from a second spacing between the second nanosheets; and
forming a workfunction metal stack comprising a first workfunction metal and a second workfunction metal, the first and second workfunction metals being formed between the first nanosheets, the first workfunction metal being formed to pinch off in the second spacing between the second nanosheets such that the second workfunction metal is absent in the second spacing between the second nanosheets.

2. The method of claim 1, wherein the first and second transistors in the vertical stack are complementary devices in which one is an n-type transistor and another one is a p-type transistor.

3. The method of claim 1, wherein one of the first and second dipole gate dielectric materials has a negative polarity and another one has a positive polarity.

4. The method of claim 1, wherein both the first and second dipole gate dielectric materials have a negative polarity.

5. The method of claim 1, wherein both the first and second dipole gate dielectric materials have a positive polarity.

6. The method of claim 1, wherein:
the first transistor is an n-type transistor having the first and second workfunction metals formed between the first nanosheets without requiring etch back of the second workfunction metal on the second transistor; and
the first workfunction metal is an n-type workfunction metal and the second workfunction metal is a p-type workfunction metal.

7. The method of claim 1, wherein:

the second transistor is a p-type transistor having the first workfunction metal formed between the second nanosheets without requiring etch back of the second workfunction metal on the second transistor; and the first workfunction metal is an n-type workfunction metal and the second workfunction metal is a p-type workfunction metal.

8. A semiconductor structure comprising:

a first transistor comprising first nanosheets, first dipole gate dielectric material being formed around the first nanosheets;

a second transistor comprising second nanosheets, second dipole gate dielectric material being formed around the second nanosheets, the first and second transistors being in a vertical stack, a first spacing between the first nanosheets being different from a second spacing between the second nanosheets; and a workfunction metal stack comprising a first workfunction metal and a second workfunction metal, the first and second workfunction metals being formed between the first nanosheets, the first workfunction metal being formed to pinch off in the second spacing between the second nanosheets such that the second workfunction metal is absent in the second spacing between the second nanosheets.

9. The semiconductor structure of claim 8, wherein the first and second transistors in the vertical stack are complementary devices in which one is an n-type transistor and another one is a p-type transistor.

10. The semiconductor structure of claim 8, wherein one of the first and second dipole gate dielectric materials has a negative polarity and another one has a positive polarity.

11. The semiconductor structure of claim 8, wherein both the first and second dipole gate dielectric materials have a negative polarity.

12. The semiconductor structure of claim 8, wherein both the first and second dipole gate dielectric materials have a positive polarity.

13. The semiconductor structure of claim 8, wherein:

the first transistor is an n-type transistor having the first and second workfunction metals formed between the first nanosheets without requiring etch back of the second workfunction metal on the second transistor; and the first workfunction metal is an n-type workfunction metal and the second workfunction metal is a p-type workfunction metal.

14. The semiconductor structure of claim 8, wherein:

the second transistor is a p-type transistor having the first workfunction metal formed between the second nanosheets without requiring etch back of the second workfunction metal on the second transistor; and the first workfunction metal is an n-type workfunction metal and the second workfunction metal is a p-type workfunction metal.

15. A method comprising:

forming a vertical stack having a first transistor below a second transistor, the first transistor comprising first nanosheets, the second transistor comprising second nanosheets, first dipole gate dielectric material being formed around the first nanosheets, second dipole gate dielectric material being formed around the second nanosheets, a first spacing between the first nanosheets being different from a second spacing between the second nanosheets;

forming another vertical stack having another first transistor below another second transistor, the another first transistor comprising another first nanosheets, the another second transistor comprising another second nanosheets, the first dipole gate dielectric material being formed around the another second nanosheets, the second dipole gate dielectric material being formed around the another first nanosheets, the first spacing between the another first nanosheets being different from the second spacing between the another second nanosheets; and forming a workfunction metal stack comprising a first workfunction metal and a second workfunction metal, the first and second workfunction metals being formed between the first nanosheets and the another first nanosheets, the first workfunction metal being formed to pinch off in the second spacing between the second nanosheets and the another second nanosheets such that the second workfunction metal is absent in the second spacing between the second nanosheets and the another second nanosheets, wherein the vertical stack has a different threshold voltage than the another vertical stack.

16. The method of claim 15, wherein:

the first and second transistors in the vertical stack are complementary devices in which one is an n-type transistor and another one is a p-type transistor; and the another first and another second transistors in the another vertical stack are complementary devices in which one is another n-type transistor and another one is another p-type transistor.

17. The method of claim 15, wherein one of the first and second dipole gate dielectric materials has a negative polarity and another one has a positive polarity.

18. The method of claim 15, wherein both the first and second dipole gate dielectric materials have a negative polarity.

19. The method of claim 15, wherein both the first and second dipole gate dielectric materials have a positive polarity.

20. The method of claim 15, wherein:

the first transistor and the another first transistor are n-type transistors having the first and second workfunction metals formed between the first nanosheets and the another first nanosheets without requiring etch back of the second workfunction metal on the second transistor and the another second transistor; and the first workfunction metal is an n-type workfunction metal and the second workfunction metal is a p-type workfunction metal.

* * * * *